United States Patent
Kuo et al.

(10) Patent No.: US 9,472,247 B2
(45) Date of Patent: Oct. 18, 2016

(54) MEMORY, SEMICONDUCTOR DEVICE INCLUDING THE SAME, AND METHOD FOR TESTING THE SAME

(71) Applicant: Taiwan Semiconductor Manufacturing Company Limited, Hsinchu (TW)

(72) Inventors: Cheng-Hsiung Kuo, Hsinchu County (TW); Gu-Huan Li, Hsinchu County (TW); Jih-Chen Wang, Hsinchu (TW); Chung-Chieh Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/621,521

(22) Filed: Feb. 13, 2015

(65) Prior Publication Data

US 2016/0240233 A1 Aug. 18, 2016

(51) Int. Cl.

| G11C 7/10 | (2006.01) |
|---|---|
| G11C 29/00 | (2006.01) |
| G11C 7/22 | (2006.01) |
| G11C 14/00 | (2006.01) |

(52) U.S. Cl.
CPC .............. G11C 7/106 (2013.01); G11C 7/22 (2013.01); G11C 29/00 (2013.01); G11C 14/0054 (2013.01); G11C 14/0063 (2013.01)

(58) Field of Classification Search
CPC .......... G11C 14/0054; G11C 14/0063; G11C 7/106; G11C 7/22; G11C 29/00
USPC ...................................................... 365/189.05
See application file for complete search history.

(56) References Cited

U.S. PATENT DOCUMENTS

| 6,469,930 B1 * | 10/2002 | Murray ................. | G11C 14/00 |
| | | | 365/154 |
| 2008/0155186 A1 * | 6/2008 | Ashokkumar ......... | G11C 14/00 |
| | | | 711/104 |
| 2009/0190402 A1 * | 7/2009 | Hsu ........................ | G11C 14/00 |
| | | | 365/185.08 |
| 2013/0308397 A1 * | 11/2013 | Kohli .................... | G11C 11/419 |
| | | | 365/189.15 |

* cited by examiner

*Primary Examiner* — Toan Le
(74) *Attorney, Agent, or Firm* — Jones Day

(57) ABSTRACT

A memory includes a first memory cell, a second memory cell, a latch unit, and a switch unit. The latch unit has a true node and a complement node. The switch unit is responsive to a first control signal and a second control signal, and is configured to connect the first memory cell to the true node and to disconnect the second memory cell from the complement node in response to the first control signal and to connect the second memory cell to the complement node and to disconnect the first memory cell from the true node in response to the second control signal. A semiconductor device that includes the memory is also disclosed. A method for testing the memory is also disclosed.

19 Claims, 24 Drawing Sheets

MEMORY, SEMICONDUCTOR DEVICE INCLUDING THE SAME, AND METHOD FOR TESTING THE SAME

BACKGROUND

A conventional method of testing a memory involves the operations of programming the memory and erasing the memory by exposing the memory to ultraviolet light (UV). The UV erase operation takes a significant amount of time, lowers productivity, and increases manufacturing costs. It is therefore desirable to provide a method for testing a memory that minimizes the number of the UV erase operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
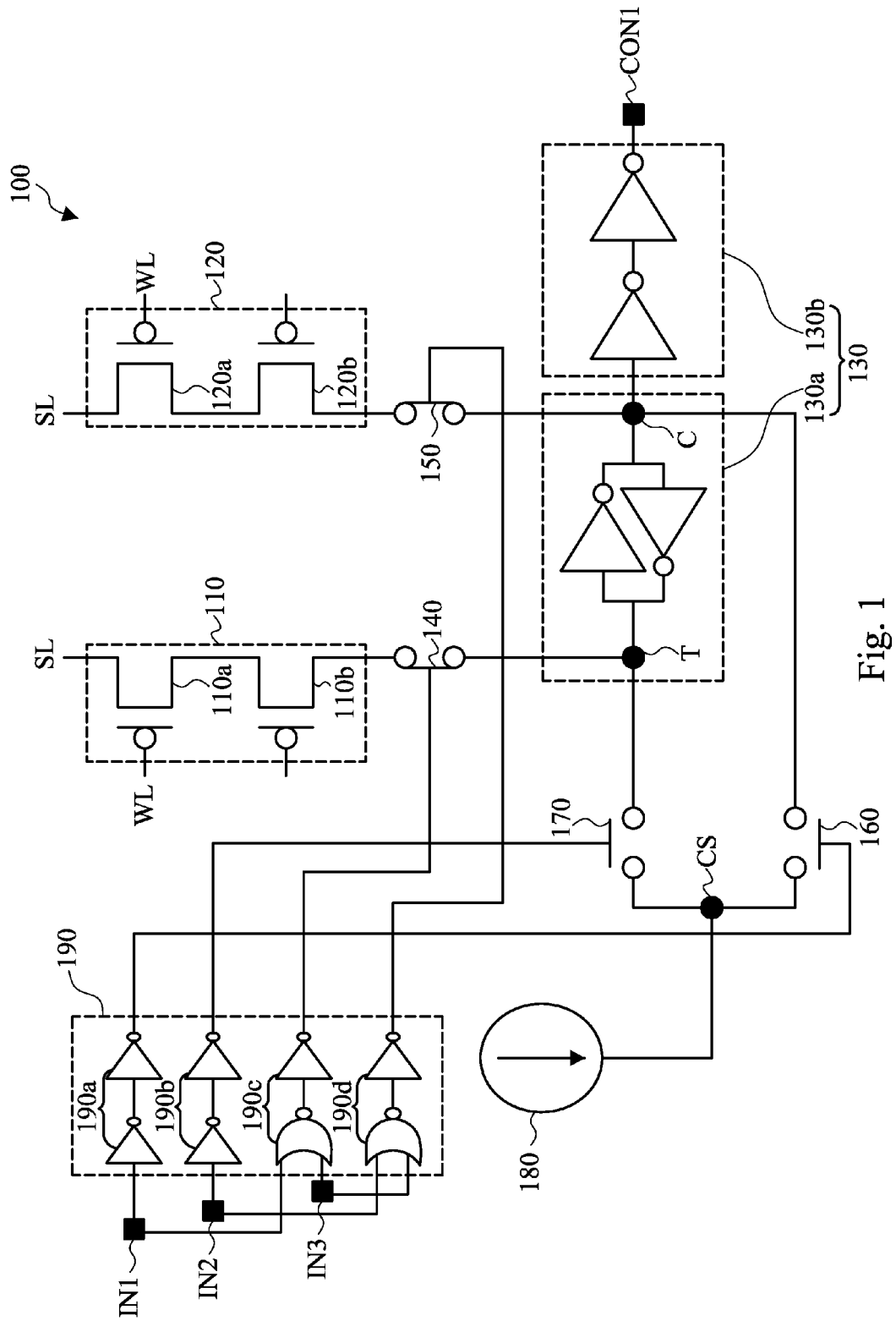
FIG. 1 is a schematic circuit diagram of the first exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides a floating gate memory that includes a memory cell. When it is desired to erase the memory cell, the memory cell is exposed to ultraviolet light (UV) to thereby decrease the amount of charges in a floating gate terminal thereof. This causes the memory cell to be less conductive. At this time, when read voltages are applied to the memory cell, a relatively low cell current flows therethrough. When it is desired to program the memory cell, write voltages are applied thereto to increase the amount of charges in the floating gate terminal thereof. This causes the memory cell to be more conductive. At this time, when read voltages are applied to the memory cell, a relatively high cell current flows therethrough. The cell current may thus represent a bit "0" or "1".

The memory of the present disclosure further includes a switch operable so as to connect and disconnect the memory cell to and from a latch unit. The construction as such, as will be described herein, permits testing of the memory without the need to program the memory cell and with a reduced number of UV erased operations performed on the memory cell.

FIG. 1 is a schematic circuit diagram of the first exemplary semiconductor device in accordance with some embodiments. As illustrated in FIG. 1, the semiconductor device 100 includes a pair of memory cells 110, 120, a latch unit 130, two pairs of switches 140, 150, 160, 170, a current source circuit 180, and a control unit 190. In some exemplary embodiments, each of the switches 140, 150 is a normally-closed switch. In some exemplary embodiments, each of the switches 160, 170 is a normally-open switch.

The memory cells 110, 120, the latch unit 130, and the switches 140, 150 constitute a memory of the semiconductor device 100. In this exemplary embodiment, the memory is a non-volatile memory, such as a read-only memory (ROM), a programmable ROM (PROM), or an erasable PROM (EPROM).

Each of the memory cells 110, 120 includes a first transistor 110a, 120a and a second transistor 110b, 120b. In this exemplary embodiment, each of the first and second transistors 110a, 120a, 110b, 120b is a P-type metal-oxide semiconductor (PMOS) transistor. Each of the first transistors 110a, 120a has a source terminal connected to a source line SL of the semiconductor device 100, a gate terminal connected to a word line WL of the semiconductor device 100, and a drain terminal. Each of the second transistors 110b, 120b has a source terminal connected to the drain terminal of a respective one of the first transistors 110a, 120a, a floating gate terminal, and a drain terminal. Since the gate terminals of the second transistors 110b, 120b of the memory cells 110, 120 are floating, the memory may be termed as a floating gate memory.

In another exemplary embodiment, at least one of the first and second transistors 110a, 120a, 110b, 120b is an N-type MOS (NMOS) transistor.

The latch unit 130 includes a two-inverter latch 130a and a buffer 130b. The latch 130a is connected to a bit line (not shown) of the semiconductor device 100 at a true node T and is further connected to a complement bit line (not shown) of the semiconductor device 100 at a complement node C. The buffer 130b includes an input terminal connected to the complement node C, an output terminal, and a pair of inverters connected in series between the input and output terminals. In an alternative exemplary embodiment, the input terminal of the buffer 130b is connected to the true node T.

Each of the switches 140, 150 has a first terminal connected to the drain terminal of a respective one of the second transistors 110b, 120b, a second terminal connected to a respective one of the true and complement nodes T, C, and a third terminal.

Each of the switches 160, 170 has a first terminal connected to a current source node CS, a second terminal connected to a respective one of the true and complement nodes T, C, and a third terminal.

In some exemplary embodiments, each of the switches 140, 150, 160, 170 is an NMOS transistor, and the first, second, and third terminals serve as drain, source, and gate terminals, respectively. In other exemplary embodiments, at least one of the switches 140, 150, 160, 170 is a PMOS transistor, a complementary MOS (CMOS), another transistor, or a combination thereof.

The current source circuit 180 is connected to the current source node CS.

The control unit 190 includes a plurality of logic gate circuits 190a, 190b, 190c, 190d. In this exemplary embodiment, each of the logic gate circuits 190a, 190b includes a pair of NOT gates, and has an input terminal, and an output terminal connected to the third terminal of a respective one of the switches 160, 170. Also, in this exemplary embodiment, each of the logic gate circuits 190c, 190d includes a NOR gate and a NOT gate, and has a first input terminal, a second input terminal, and an output terminal connected to the third terminal of a respective one of the switches 140, 150.

The semiconductor device 100 further includes a plurality of inputs IN1, IN2, IN3 and a contact CON1. The input IN1 is connected to the input terminal of the logic gate circuit 190a and the first input terminal of the logic gate circuit 190c. The input IN2 is connected to the input terminal of the logic gate circuit 190b and the first input terminal of the logic gate circuit 190d. The input IN3 is connected to the second input terminals of the logic gate circuits 190c, 190d. The contact CON1 is connected to the output terminal of the buffer 130b.

An exemplary method 1200 for testing the memory of the semiconductor device 100 will be described with reference to FIGS. 10-12 further below.

Figure 2:
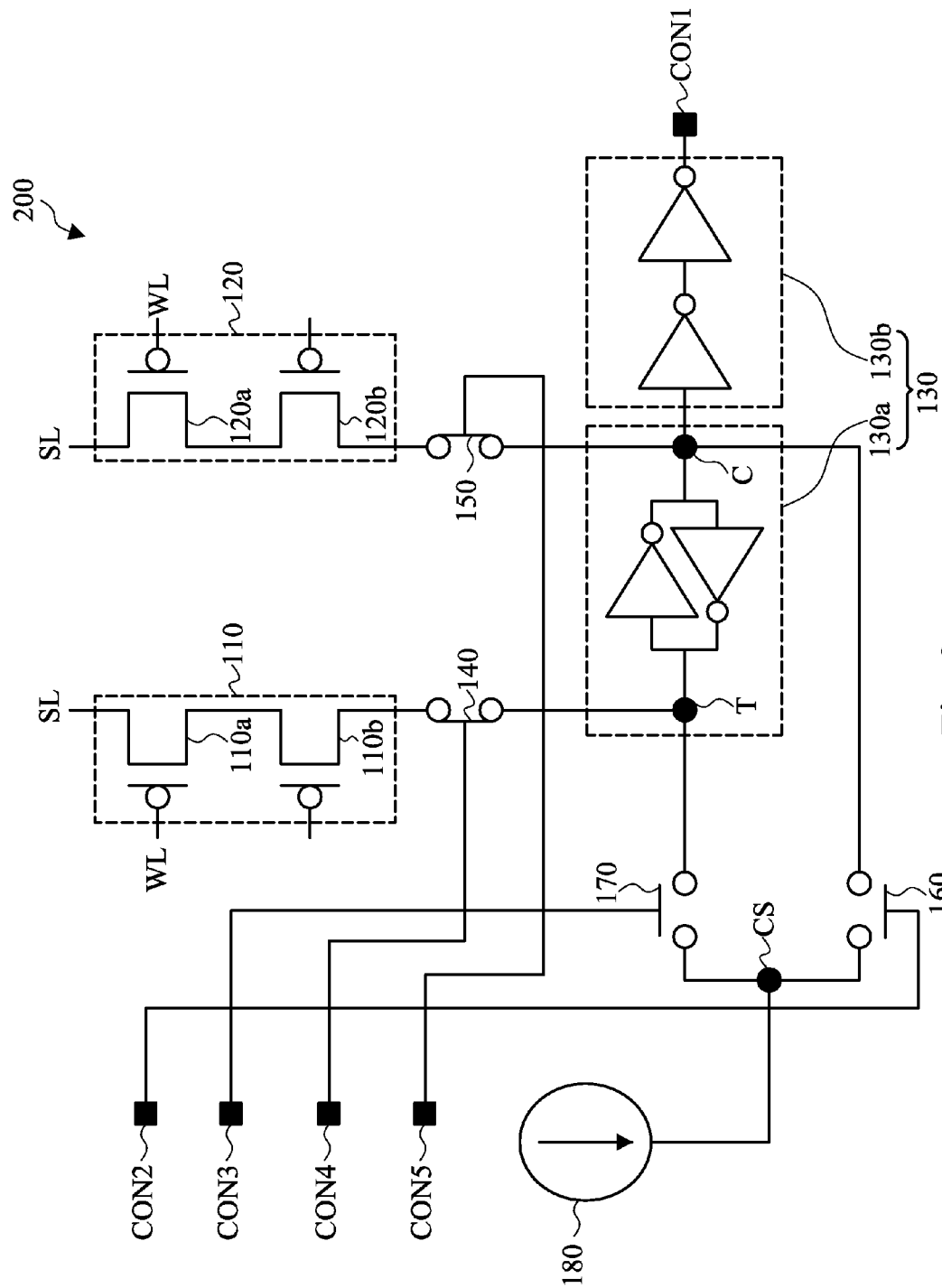
FIG. 2 is a schematic circuit diagram of the second exemplary semiconductor device in accordance with some embodiments.

FIG. 2 is a schematic circuit diagram of the second exemplary semiconductor device in accordance with some embodiments. As illustrated in FIG. 2, the semiconductor device 200 differs from the semiconductor device 100 in that the control unit 190 is dispensed with. The semiconductor device 200 further includes a plurality of contacts CON2, CON3, CON4, CON5 connected to the third terminals of the switches 160, 170, 140, 150, respectively.

Figure 3:
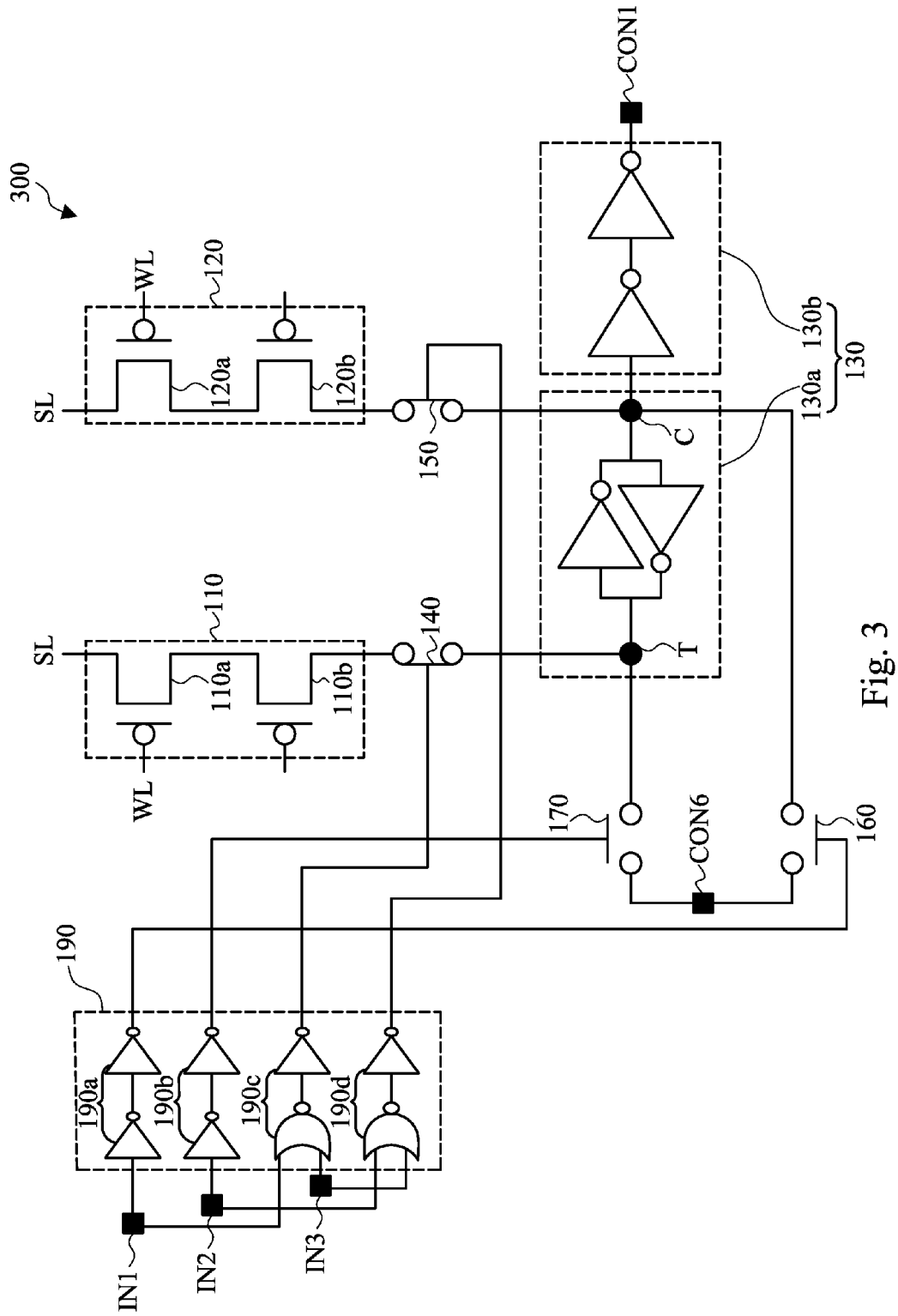
FIG. 3 is a schematic circuit diagram of the third exemplary semiconductor device in accordance with some embodiments.

FIG. 3 is a schematic circuit diagram of the third exemplary semiconductor device in accordance with some embodiments. As illustrated in FIG. 3, the semiconductor device 300 differs from the semiconductor device 100 in that the current source circuit 180 is dispensed with. The semiconductor device 300 further includes a contact CON6 connected to the first terminals of the switches 160, 170.

Figure 4:
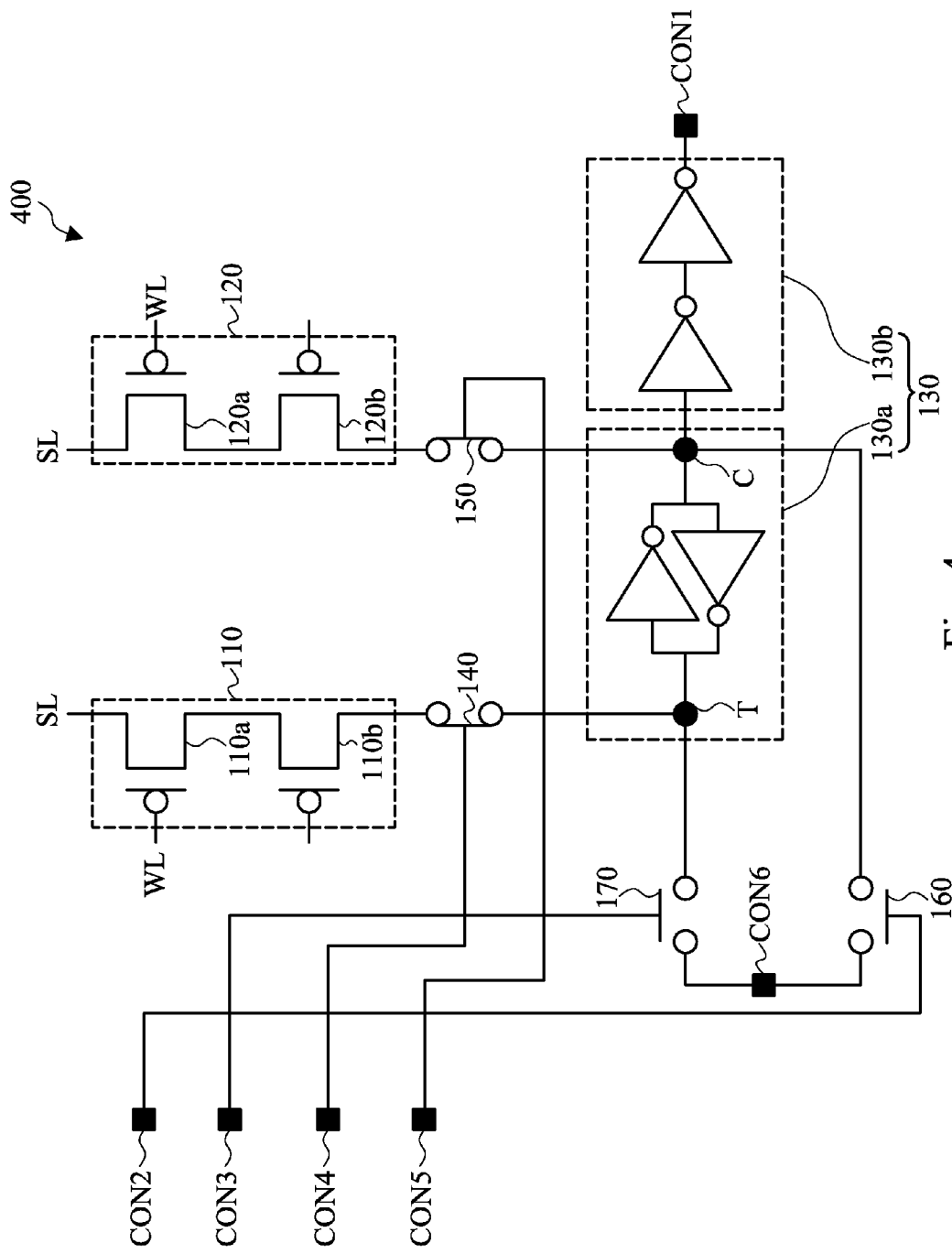
FIG. 4 is a schematic circuit diagram of the fourth exemplary semiconductor device in accordance with some embodiments.

FIG. 4 is a schematic circuit diagram of the fourth exemplary semiconductor device in accordance with some embodiments. As illustrated in FIG. 4, the semiconductor device 400 differs from the semiconductor device 100 in that the current source circuit 180 and the control unit 190 are dispensed with. The semiconductor device 400 further includes a plurality of contacts CON2, CON3, CON4, CON5, CON6. The contacts CON2, CON3, CON4, CON5 are connected to the third terminals of the switches 160, 170, 140, 150, respectively. The contact CON6 is connected to the first terminals of the switches 160, 170.

Figure 5:
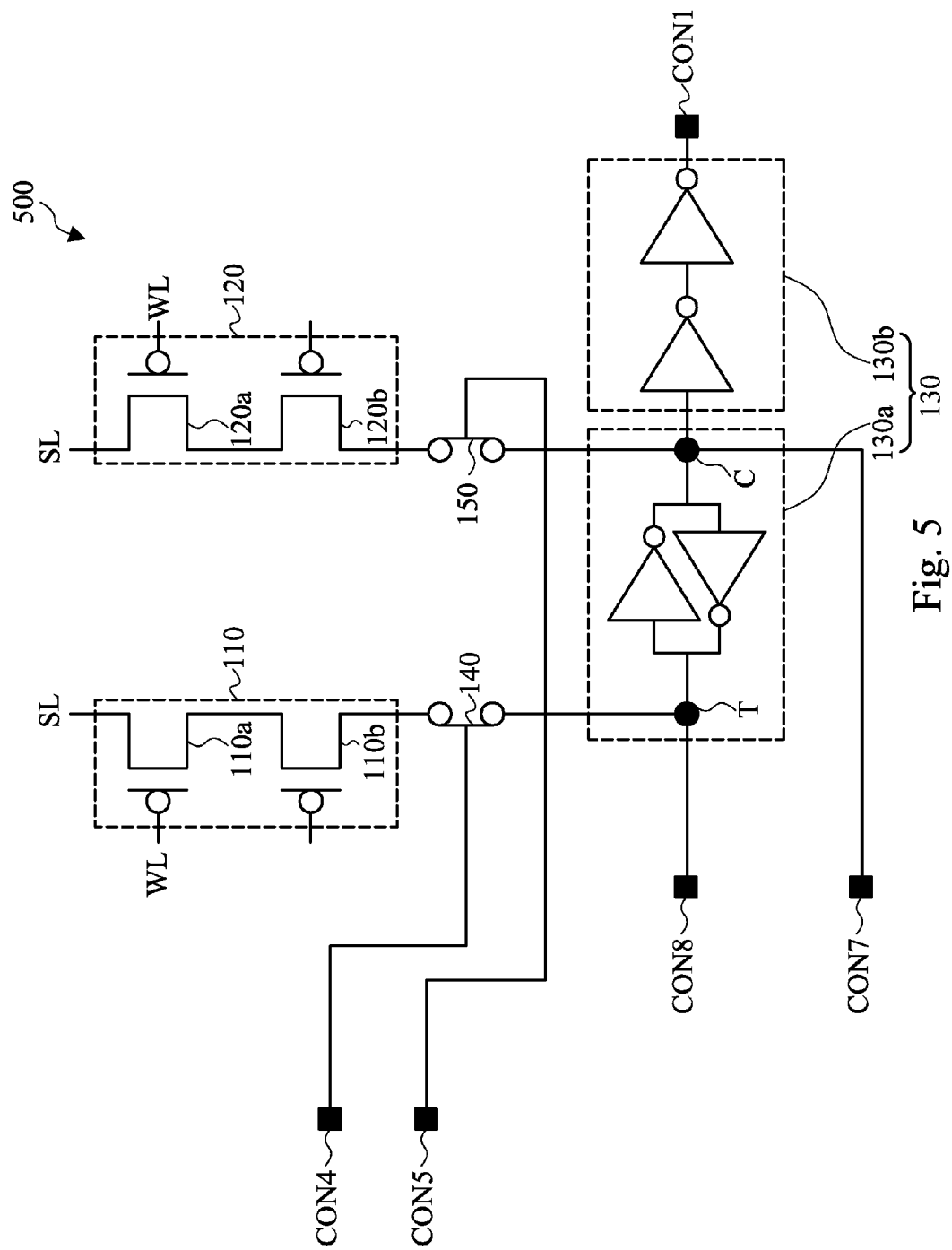
FIG. 5 is a schematic circuit diagram of the fifth exemplary semiconductor device in accordance with some embodiments.

FIG. 5 is a schematic circuit diagram of the fifth exemplary semiconductor device in accordance with some embodiments. As illustrated in FIG. 5, the semiconductor device 500 differs from the semiconductor device 100 in that the switches 160, 170, the current source circuit 180, and the control unit 190 are dispensed with. The semiconductor device 500 further includes a plurality of contacts CON4, CON5, CON7, CON8. The contacts CON4, CON5 are connected to the third terminals of the switches 140, 150, respectively. The contacts CON7, CON8 are connected to the complement and true nodes C, T, respectively.

Figure 6:
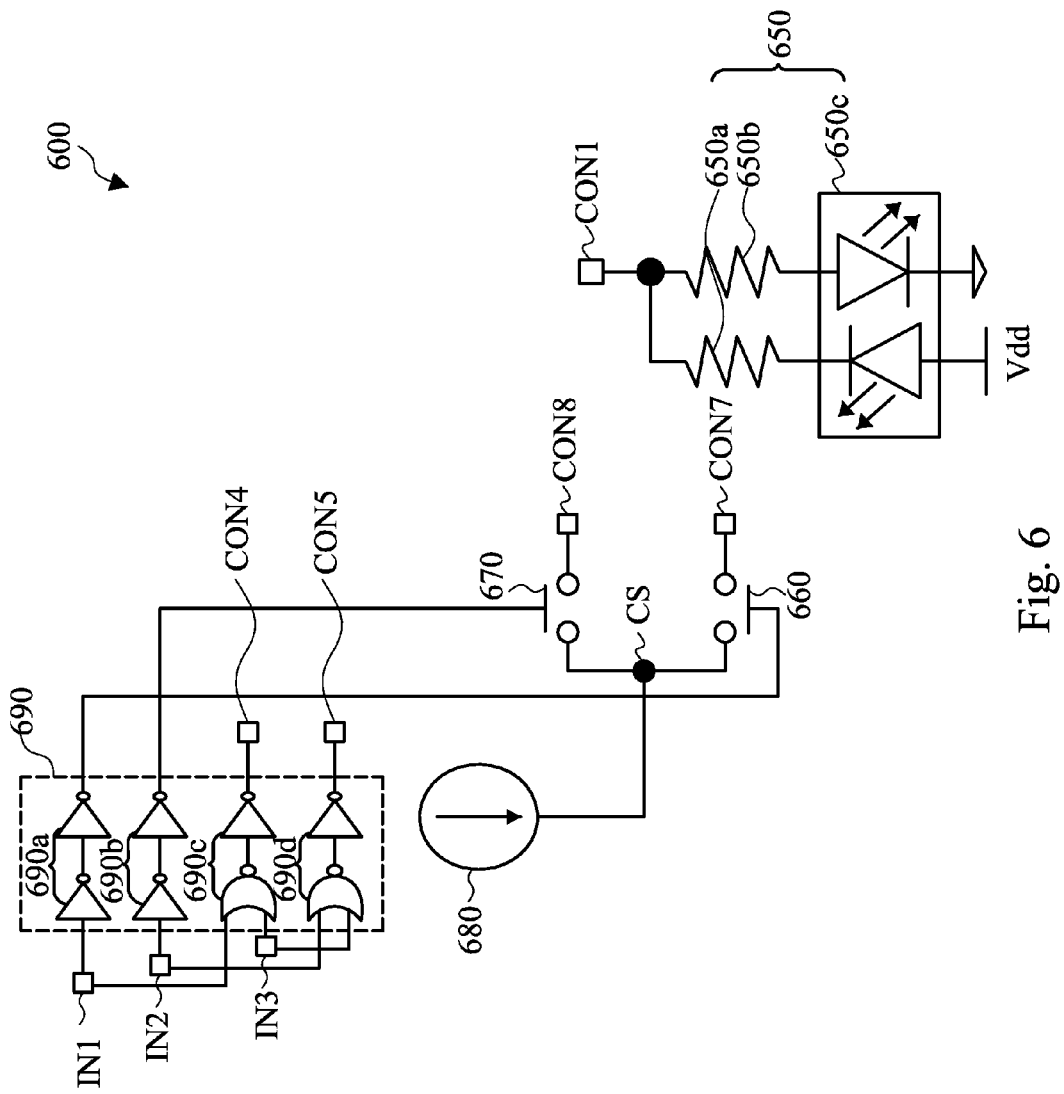
FIG. 6 is a schematic circuit diagram of the first exemplary test device in accordance with some embodiments.

FIG. 6 is a schematic circuit diagram of the first exemplary test device in accordance with some embodiments. As illustrated in FIG. 6, the test device 600 includes a pair of switches 660, 670, a current source circuit 680, a control unit 690, and an indicating unit 650. In some exemplary embodiments, each of the switches 660, 670 is a normally-open switch.

Each of the switches 660, 670 has a first terminal connected to a current source node CS, a second terminal, and a third terminal. In an exemplary embodiment, each of the switches 660, 670 is an NMOS transistor, and the first, second, and third terminals serve as drain, source, and gate terminals, respectively. In another exemplary embodiment, at least one of the switches 660, 670 is a PMOS transistor, a CMOS, another transistor, or a combination thereof.

The current source circuit 680 is connected to the current source node CS.

The control unit 690 includes a plurality of logic gate circuits 690a, 690b, 690c, 690d. In this exemplary embodiment, each of the logic gate circuits 690a, 690b includes a pair of NOT gates, and has an input terminal, and an output terminal connected to the third terminal of a respective one of the switches 660, 670. Also, in this exemplary embodiment, each of the logic gate circuits 690c, 690d includes a NOR gate and a NOT gate, and has a first input terminal, a second input terminal, and an output terminal.

The indicating unit 650 includes a pair of resistors 650a, 650b, and a light source 650c. Each of the resistors 650a, 650b has a first terminal and a second terminal. In this exemplary embodiment, the light source 650c is a dual-color light-emitting diode, and has a pair of first terminals connected to the second terminals of the resistors 260a, 260b, respectively, and a pair of second terminals connected to a supply voltage Vdd and the ground, respectively.

The test device 600 further includes a plurality of inputs IN1, IN2, IN3 and a plurality of contacts CON1, CON4, CON5, CON7, CON8. The contact CON1 is connected to the first terminals of the resistors 650a, 650b. The contacts CON4, CON5 are connected to the output terminals of the logic gate circuits 690c, 690d, respectively. The contacts CON7, CON8 are connected to the second terminals of the switches 660, 670, respectively.

An exemplary method 2400 for testing the memory of the semiconductor device 500 using the test device 600 will be described with reference to FIGS. 22-24 below.

Figure 7:
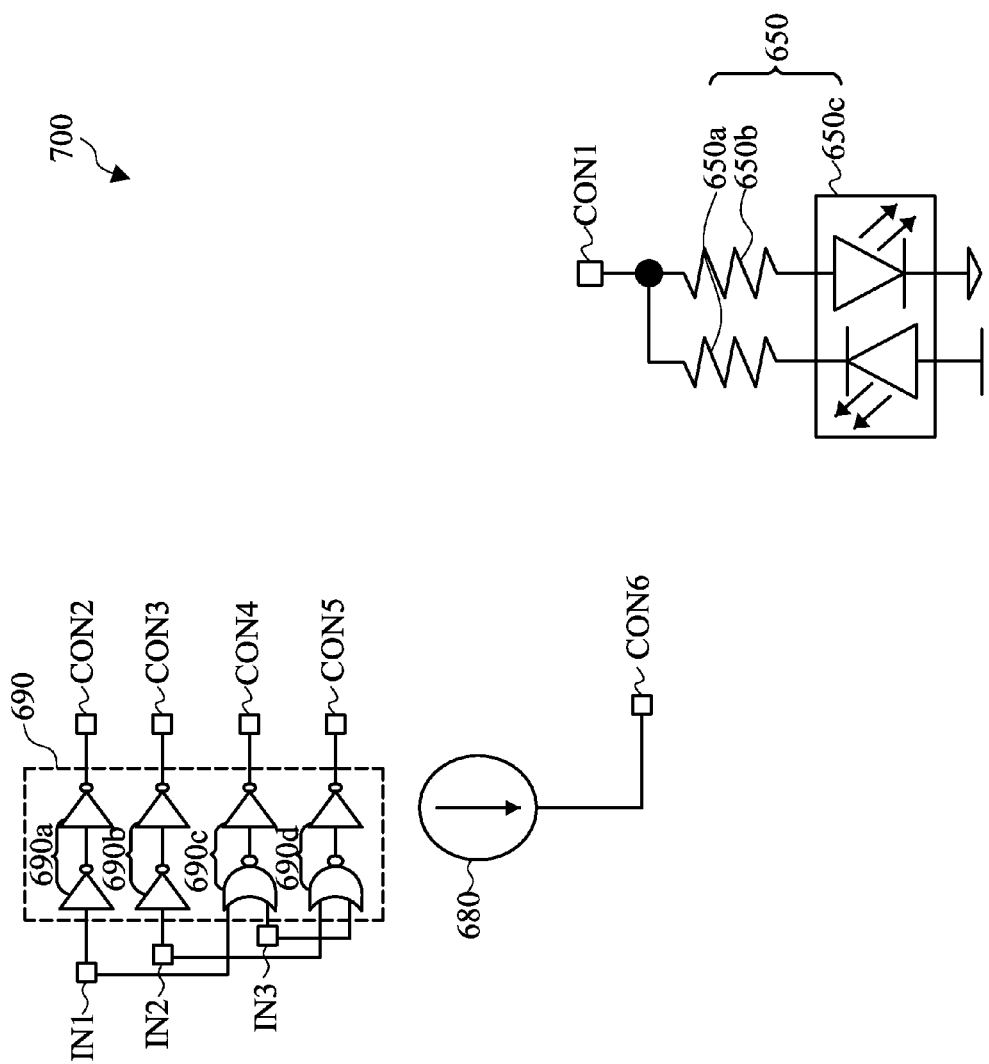
FIG. 7 is a schematic circuit diagram of the second exemplary test device in accordance with some embodiments.

FIG. 7 is a schematic circuit diagram of the second exemplary test device in accordance with some embodiments. As illustrated in FIG. 7, the test device 700 differs from the test device 600 in that the switches 660, 670 are dispensed with. The test device 700 further includes a plurality of contacts CON2, CON3, CON6. The contacts CON2, CON3 are connected to the output terminals of the logic gate circuits 690a, 690b, respectively. The contact CON6 is connected to the current source circuit 680.

An exemplary method 2100 for testing the memory of the semiconductor device 400 using the test device 700 will be described with reference to FIGS. 19-21 below.

Figure 8:
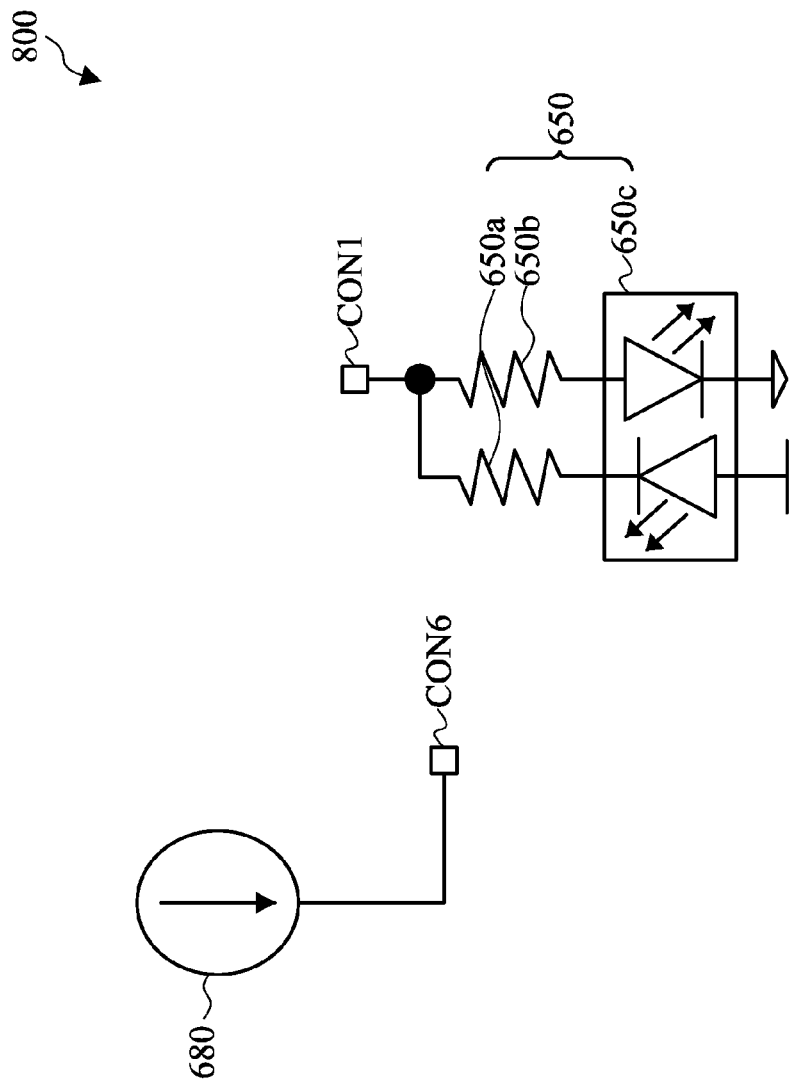
FIG. 8 is a schematic circuit diagram of the third exemplary test device in accordance with some embodiments.

FIG. 8 is a schematic circuit diagram of the third exemplary test device in accordance with some embodiments. As illustrated in FIG. 8, the test device 800 differs from the test device 600 in that the switches 660, 670 and the control unit 690 are dispensed with. The test device 800 further includes a contact CON6 connected to the current source circuit 680.

An exemplary method 1800 for testing the memory of the semiconductor device 300 using the test device 800 will be described with reference to FIGS. 16-18 below.

Figure 9:
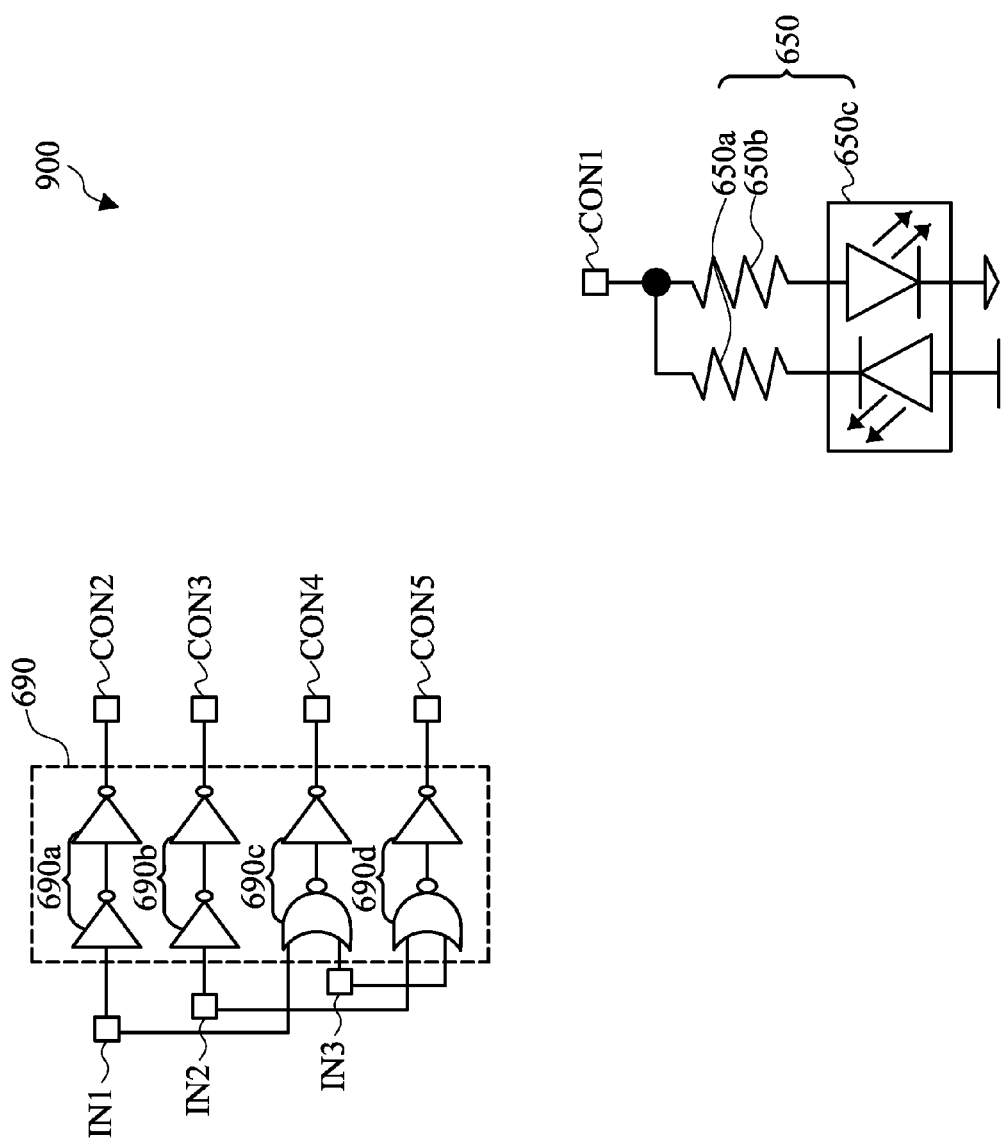
FIG. 9 is a schematic circuit diagram of the fourth exemplary test device in accordance with some embodiments.

FIG. 9 is a schematic circuit diagram of the fourth exemplary test device in accordance with some embodiments. As illustrated in FIG. 9, the test device 900 differs from the test device 600 in that the switches 660, 670 and the current source circuit 680 are dispensed with. The test device 900 further includes a plurality of contacts CON2, CON3 connected to the output terminals of the logic gate circuits 690a, 690b, respectively.

An exemplary method 1500 for testing the memory of the semiconductor device 200 using the test device 900 will be described with reference to FIGS. 13-15 below.

An exemplary method 1200 for testing the memory of the semiconductor device 100 will now be described with reference to FIGS. 10-12. FIG. 10 is a schematic circuit diagram illustrating a state of a switch unit in accordance with some embodiments. FIG. 11 is a schematic circuit diagram illustrating another state of the switch unit in accordance with some embodiments. FIG. 12 is a flowchart of the first exemplary method for testing a memory of a semiconductor device in accordance with some embodiments.

In response to a first input signal, in operation 1205, the control unit 190 generates a first control signal that corresponds to the first input signal. In this exemplary embodiment, the first input signal includes a set of logic levels, each of which is applied to a respective one of the inputs IN1, IN2, IN3, and the first control signal includes a set of logic levels, each of which is generated at the output terminal of a respective one of the logic gate circuits 190a, 190b, 190c, 190d.

Figure 10:
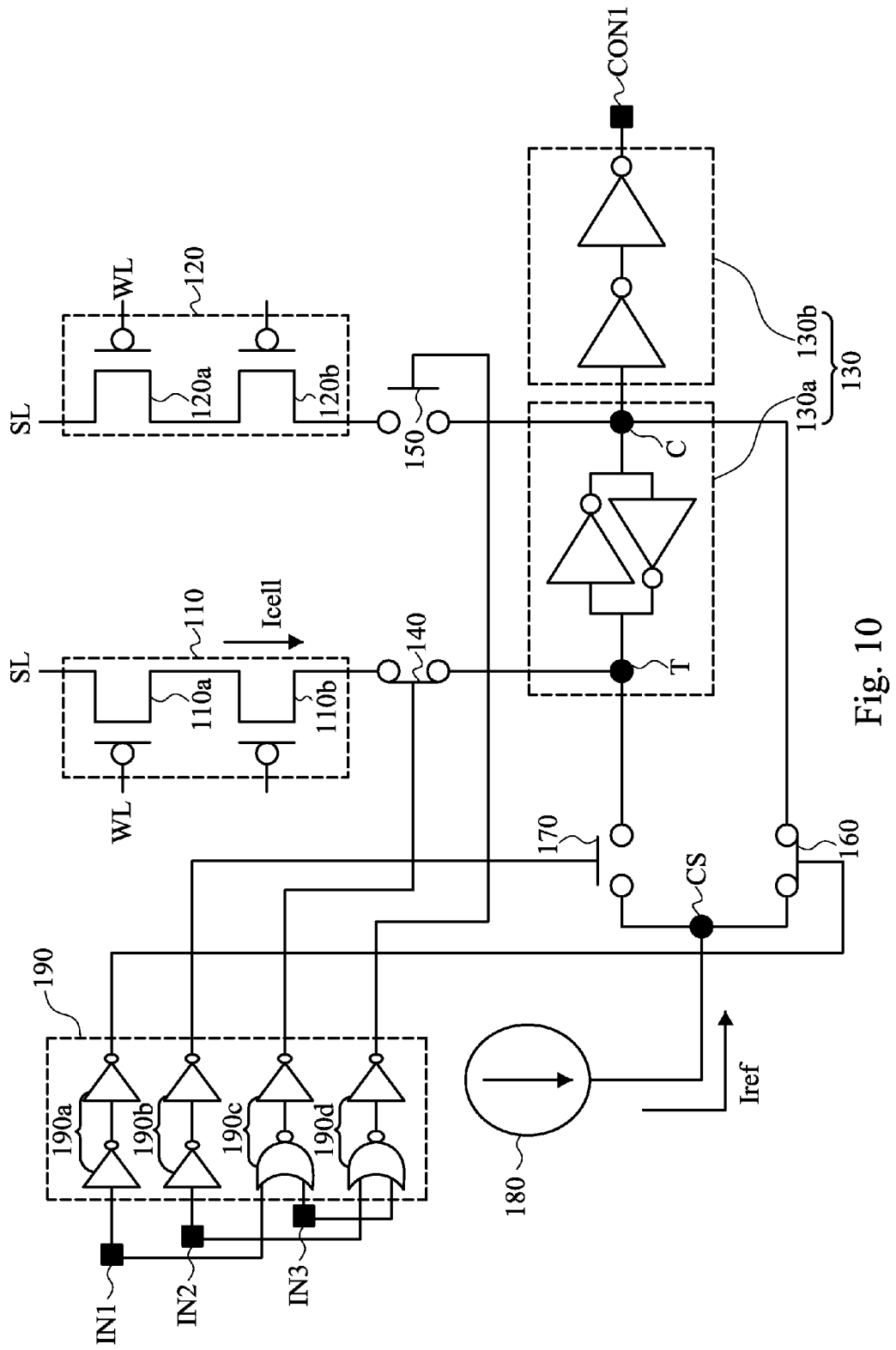
FIG. 10 is a schematic circuit diagram illustrating a state of a switch unit in accordance with some embodiments.

As illustrated in FIG. 10, in response to the first control signal, in operation 1210: the switch 150 disconnects the memory cell 120 from the complement node C; the switch 140 connects the memory cell 110 to the true node T; the switch 170 disconnects the current source node CS from the true node T; and the switch 160 connects the current source node CS to the complement node C.

Thereafter, in operation 1215, the memory cell 110 generates a cell current Icell that flows to the true node T through the switch 140, and the current source circuit 180 generates a reference current Iref that flows to the complement node C through the current source node CS and the switch 160.

In operation 1220, the latch 130a generates a voltage at the true node T and another voltage at the complement node C.

In operation 1225, the buffer 130b generates an output signal, e.g., a logic level, at the output terminal thereof that corresponds to the voltage at the complement node C.

In response to a second input signal, in operation 1230, the control unit 190 generates a second control signal that corresponds to the second input signal. In this exemplary embodiment, the second input signal includes a set of logic levels, each of which is applied to a respective one of the inputs IN1, IN2, IN3, and the second control signal includes a set of logic levels, each of which is generated at the output terminal of a respective one of the logic gate circuits 190a, 190b, 190c, 190d.

Figure 11:
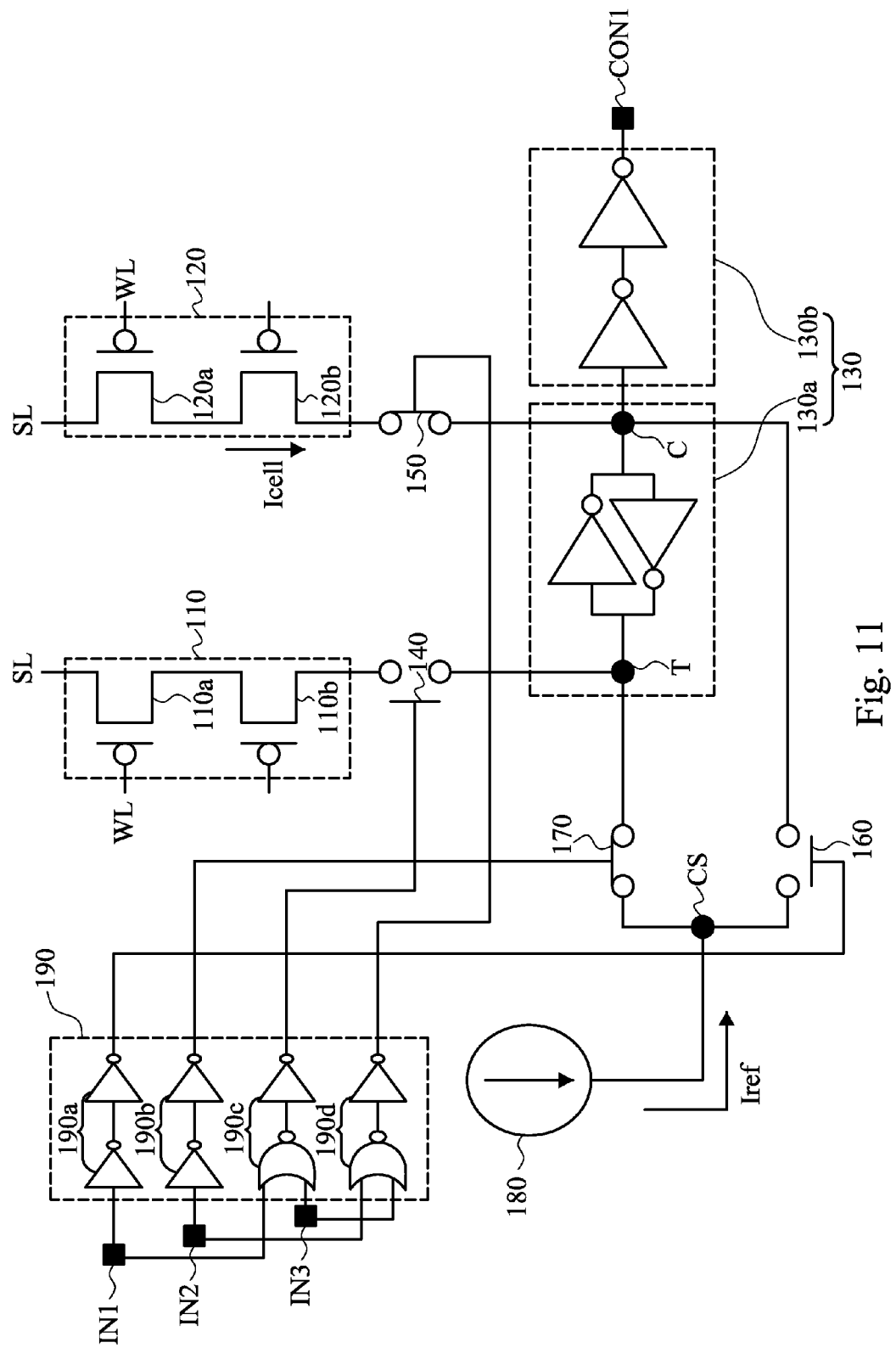
FIG. 11 is a schematic circuit diagram illustrating another state of the switch unit in accordance with some embodiments.
Figure 12:
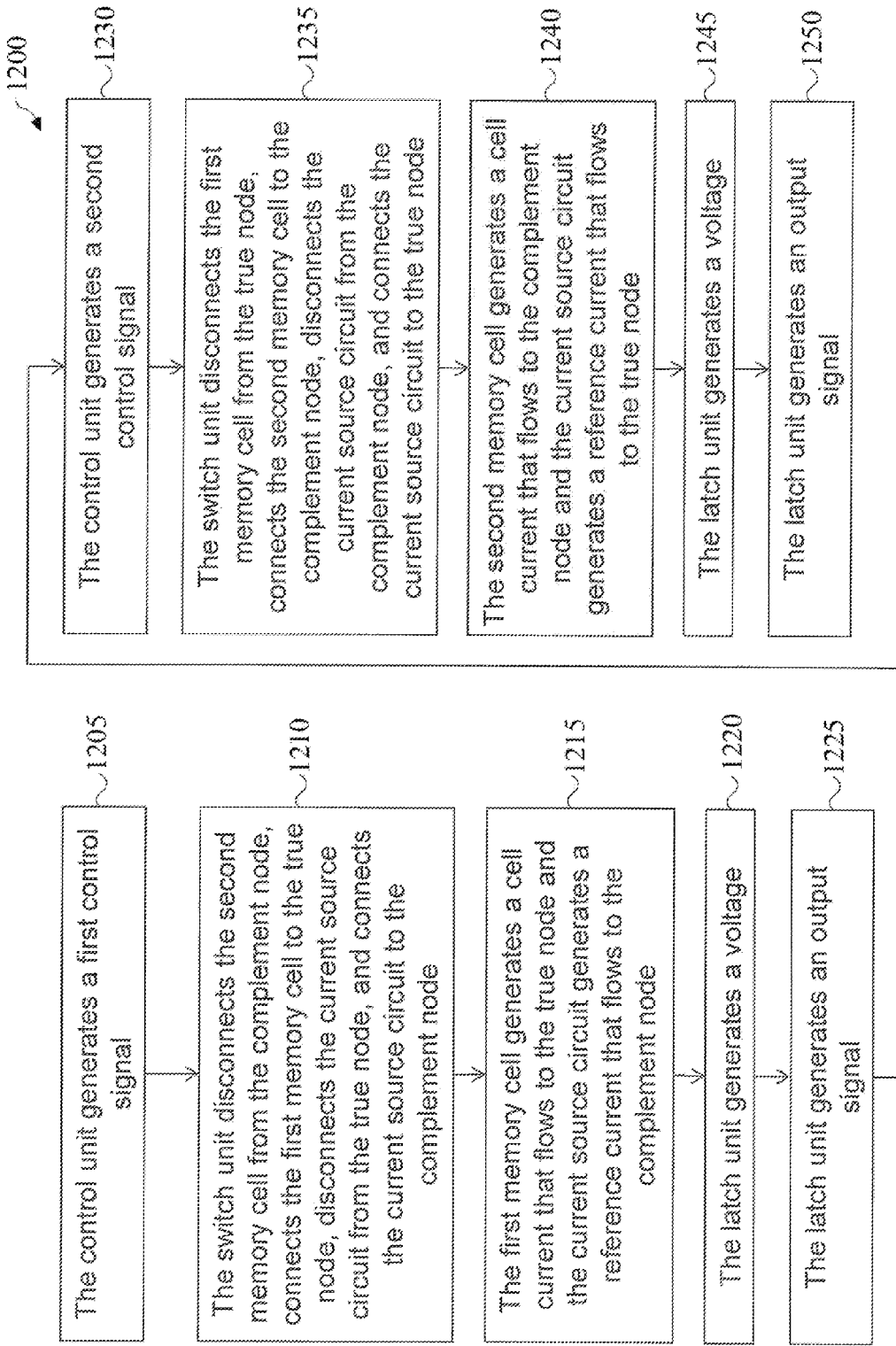
FIG. 12 is a flowchart of the first exemplary method for testing a memory of a semiconductor device in accordance with some embodiments.

As illustrated in FIG. 11, in response to the second control signal, in operation 1235: the switch 140 disconnects the memory cell 110 from the true node T; the switch 150 connects the memory cell 120 to the complement node C; the switch 160 disconnects the current source node CS from the complement node C; and the switch 170 connects the current source node CS to the true node T.

Thereafter, in operation 1240, the memory cell 120 generates a cell current Icell that flows to the complement node C through the switch 150, and the current source circuit 180 generates a reference current Iref that flows to the true node T through the current source node CS and the switch 170.

In operation 1245, the latch 130a generates a voltage at the true node T and another voltage at the complement node C.

In operation 1250, the buffer 130b generates an output signal, e.g., a logic level, at the output terminal thereof that corresponds to the voltage at the complement node C.

The logic level of the output signal at the contact CON1 may be determined with the use of a logic probe. When the logic level of the output signal in operation 1225 is logic 1 and when the logic level of the output signal in operation 1250 is logic 0, the memory of the semiconductor device 100 is verified to be functioning properly. Otherwise, e.g., when the logic levels of the output signals in operations 1225 and 1250 are the same, the memory of the semiconductor device 100 is determined to be defective.

An exemplary method 1500 for testing the memory of the semiconductor device 200 using the test device 900 will now be described with reference to FIGS. 13-15. FIG. 13 is a schematic circuit diagram illustrating a state of a switch unit in accordance with some embodiments. FIG. 14 is a schematic circuit diagram illustrating another state of the switch unit in accordance with some embodiments. FIG. 15 is a flowchart of the second exemplary method for testing a memory of a semiconductor device in accordance with some embodiments.

Figure 13:
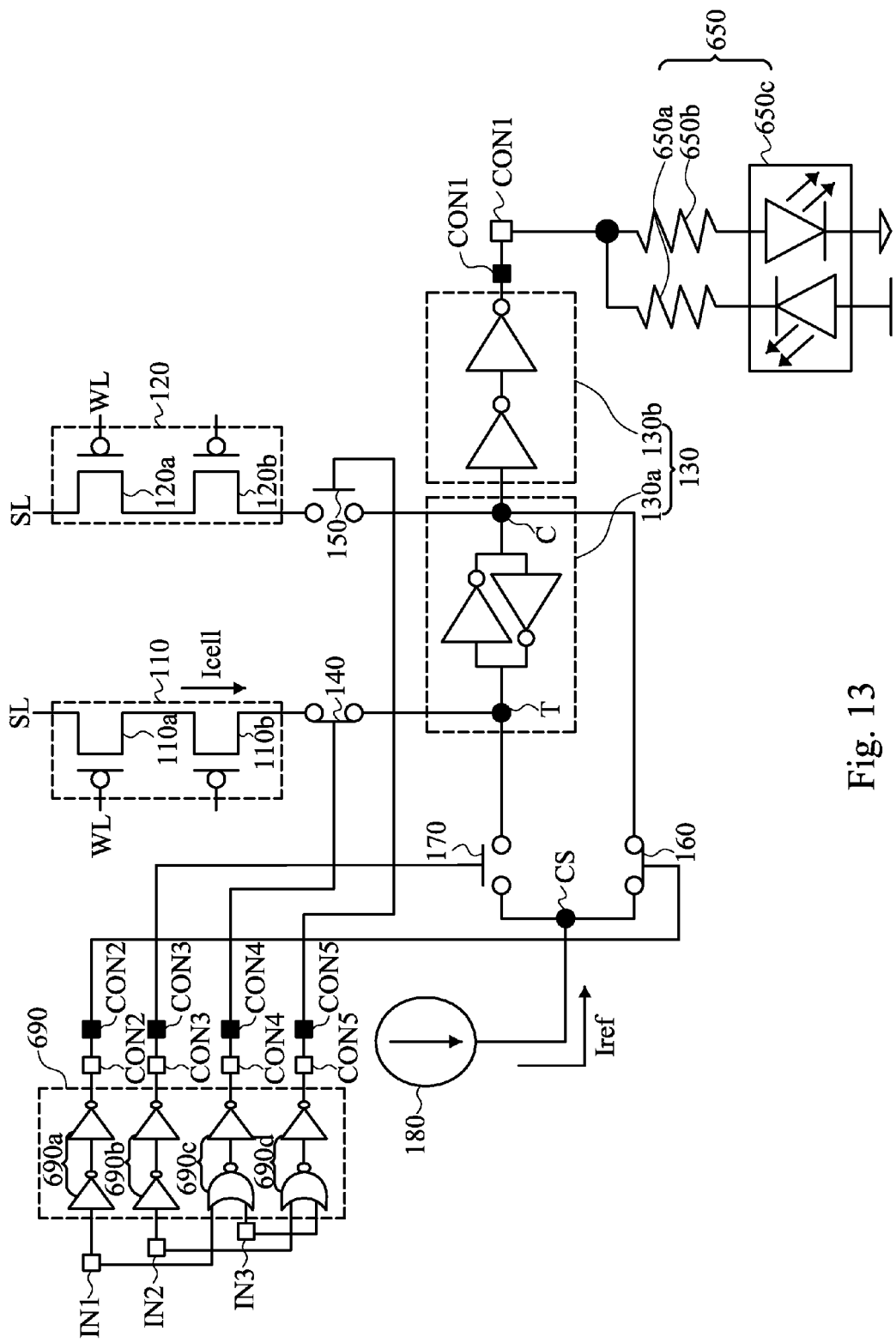
FIG. 13 is a schematic circuit diagram illustrating a state of a switch unit in accordance with some embodiments.
Figure 14:
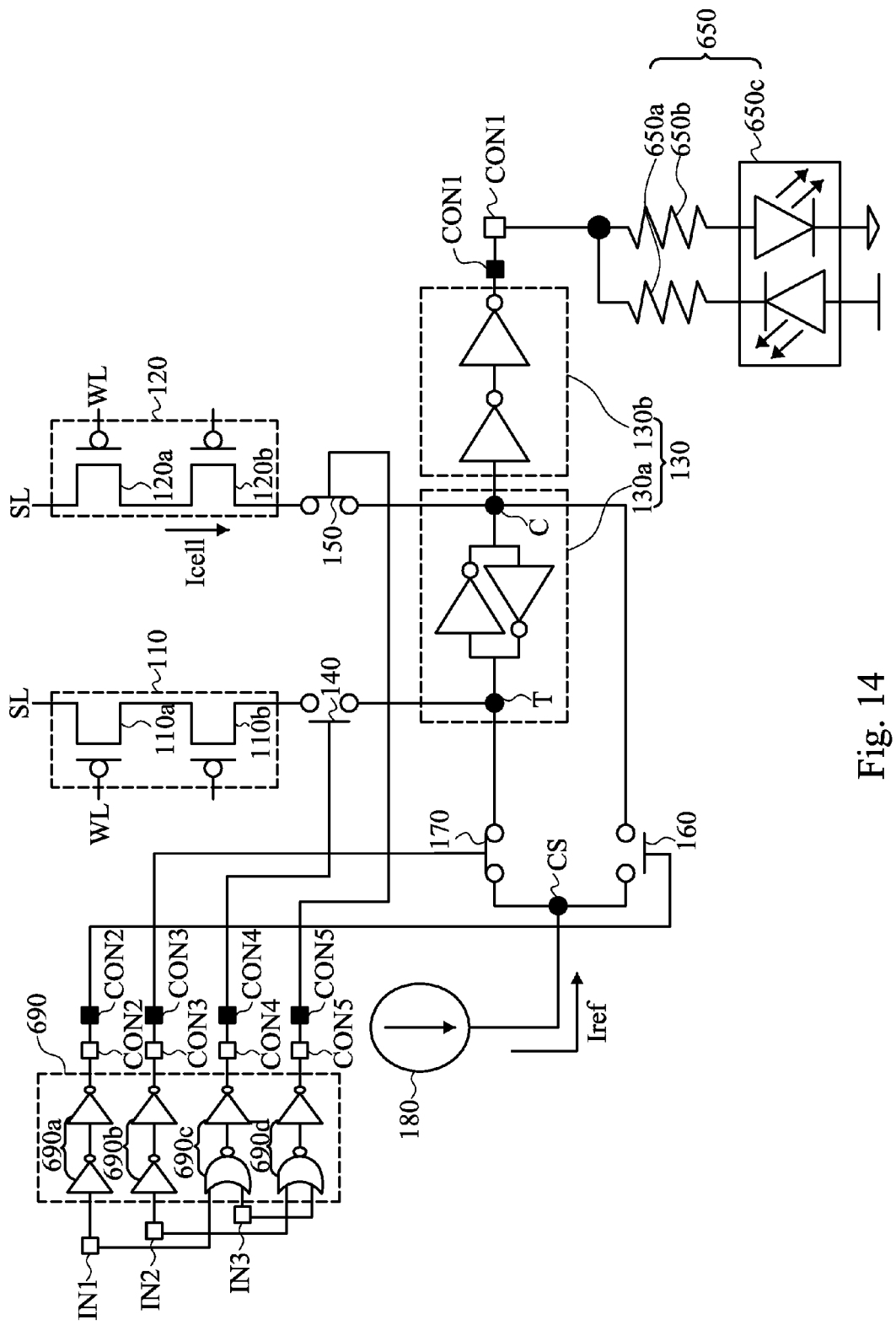
FIG. 14 is a schematic circuit diagram illustrating another state of the switch unit in accordance with some embodiments.
Figure 15:
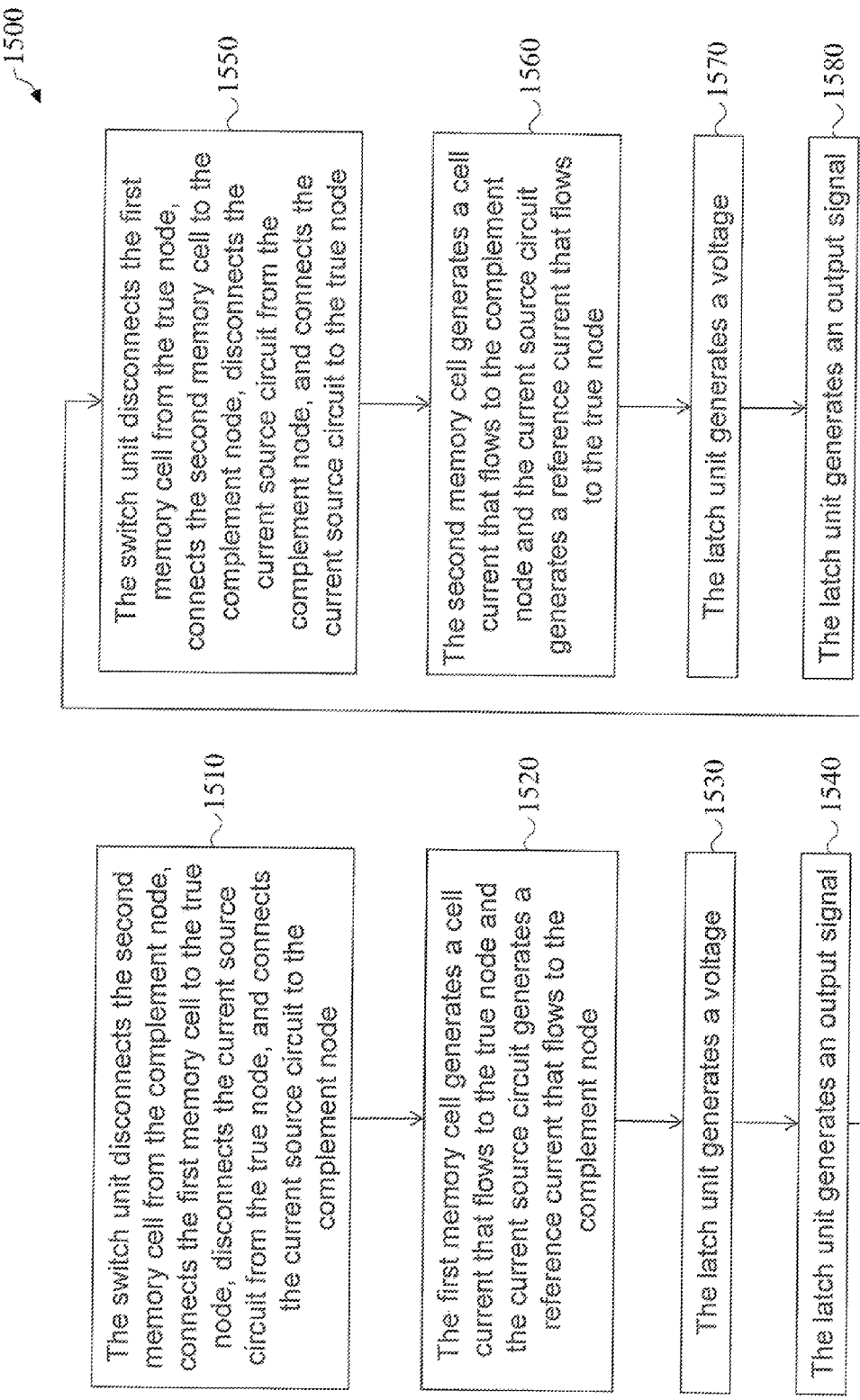
FIG. 15 is a flowchart of the second exemplary method for testing a memory of a semiconductor device in accordance with some embodiments.

As illustrated in FIGS. 13 and 14, the contacts CON1, CON2, CON3, CON4, CON5 of the test device 900 are connected to the contacts CON1, CON2, CON3, CON4, CON5 of the semiconductor device 200, respectively.

In response to a first input signal, the control unit 690 generates a first control signal that corresponds to the first input signal. In this exemplary embodiment, the first input signal includes a set of logic levels, each of which is applied to a respective one of the inputs IN1, IN2, IN3, and the first control signal includes a set of logic levels, each of which is generated at the output terminal of a respective one of the logic gate circuits 690a, 690b, 690c, 690d.

As illustrated in FIG. 13, in response to the first control signal, in operation 1510: the switch 150 disconnects the memory cell 120 from the complement node C; the switch 140 connects the memory cell 110 to the true node T; the switch 170 disconnects the current source node CS from the true node T; and the switch 160 connects the current source node CS to the complement node C.

Thereafter, in operation 1520, the memory cell 110 generates a cell current Icell that flows to the true node T through the switch 140, and the current source circuit 180 generates a reference current Iref that flows to the complement node C through the current source node CS and the switch 160.

In operation 1530, the latch 130a generates a voltage at the true node T and another voltage at the complement node C.

In operation 1540, the buffer 130b generates an output signal, e.g., a logic level, at the output terminal thereof that corresponds to the voltage at the complement node C.

In response to the output signal, the light source 650c emits light, the color of which corresponds to the output signal. For example, the light source 650c emits a green light if the output signal is logic 1 or a red light if logic 0.

In response to a second input signal, the control unit 690 generates a second control signal that corresponds to the second input signal. In this exemplary embodiment, the second input signal includes a set of logic levels, each of which is applied to a respective one of the inputs IN1, IN2, IN3, and the second control signal includes a set of logic levels, each of which is generated at the output terminal of a respective one of the logic gate circuits 690a, 690b, 690c, 690d.

As illustrated in FIG. 14, in response to the second control signal, in operation 1550: the switch 140 disconnects the memory cell 110 from the true node T; the switch 150 connects the memory cell 120 to the complement node C; the switch 160 disconnects the current source node CS from the complement node C; and the switch 170 connects the current source node CS to the true node T.

Thereafter, in operation 1560, the memory cell 120 generates a cell current Icell that flows to the complement node C through the switch 150, and the current source circuit 180 generates a reference current Iref that flows to the true node T through the current source node CS and the switch 170.

In operation 1570, the latch 130a generates a voltage at the true node T and another voltage at the complement node C.

In operation 1580, the buffer 130b generates an output signal, e.g., a logic level, at the output terminal thereof that corresponds to the voltage at the complement node C.

In response to the output signal, the light source 650c emits light, the color of which corresponds to the output signal. For example, the light source 650c emits a green light if the output signal is logic 1 or a red light if logic 0.

When the logic level of the output signal in operation 1540 is logic 1 and when the logic level of the output signal in operation 1580 is logic 0, the memory of the semiconductor device 200 is verified to be functioning properly. Otherwise, e.g., when the logic levels of the output signals in operations 1540 and 1580 are the same, the memory of the semiconductor device 200 is determined to be defective.

An exemplary method 1800 for testing the memory of the semiconductor device 300 using the test device 800 will now be described with reference to FIGS. 16-18. FIG. 16 is a schematic circuit diagram illustrating a state of a switch unit in accordance with some embodiments. FIG. 17 is a schematic circuit diagram illustrating another state of the switch unit in accordance with some embodiments. FIG. 18 is a flowchart of the third exemplary method for testing a memory of a semiconductor device in accordance with some embodiments.

Figure 16:
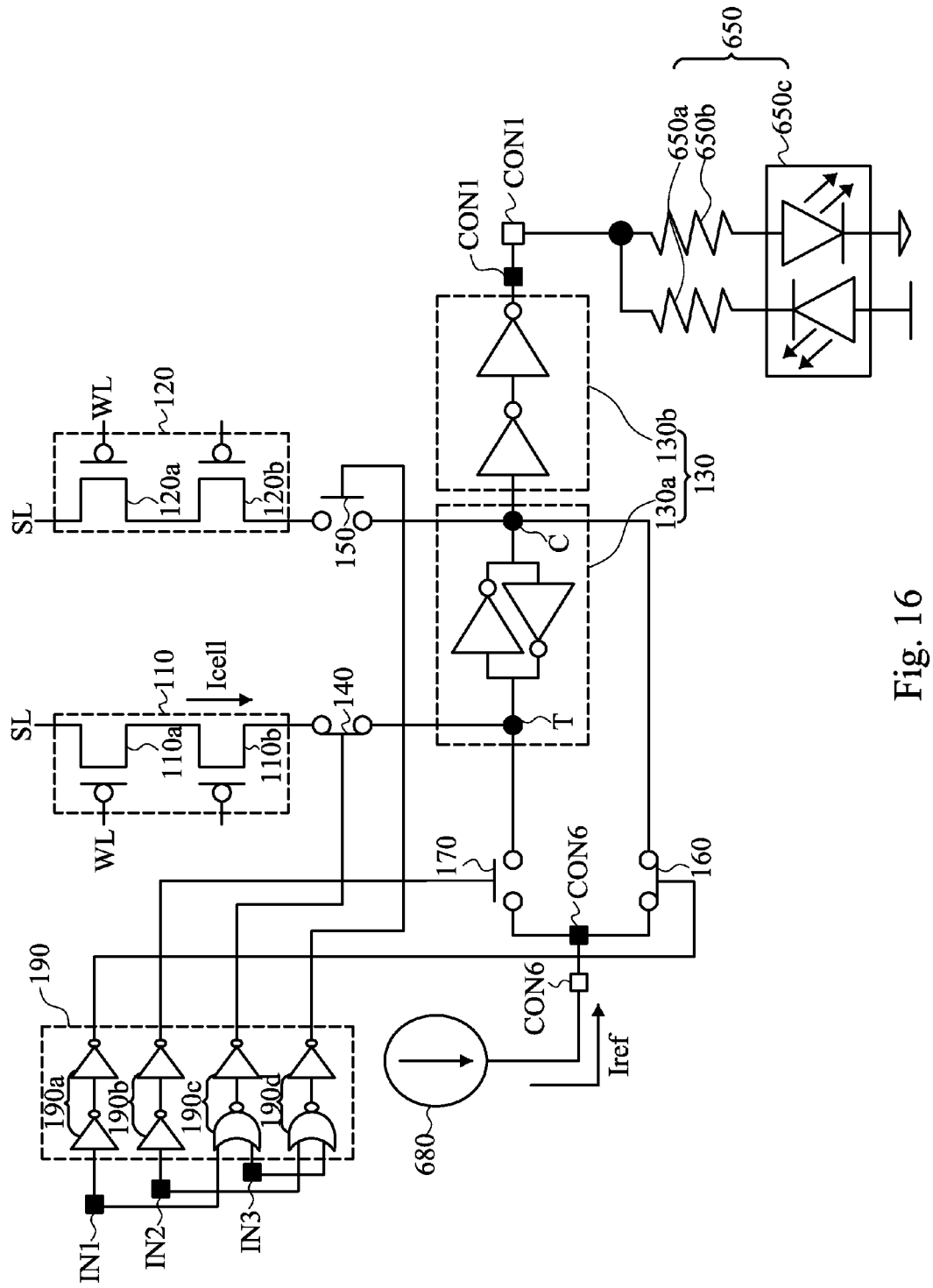
FIG. 16 is a schematic circuit diagram illustrating a state of a switch unit in accordance with some embodiments.
Figure 17:
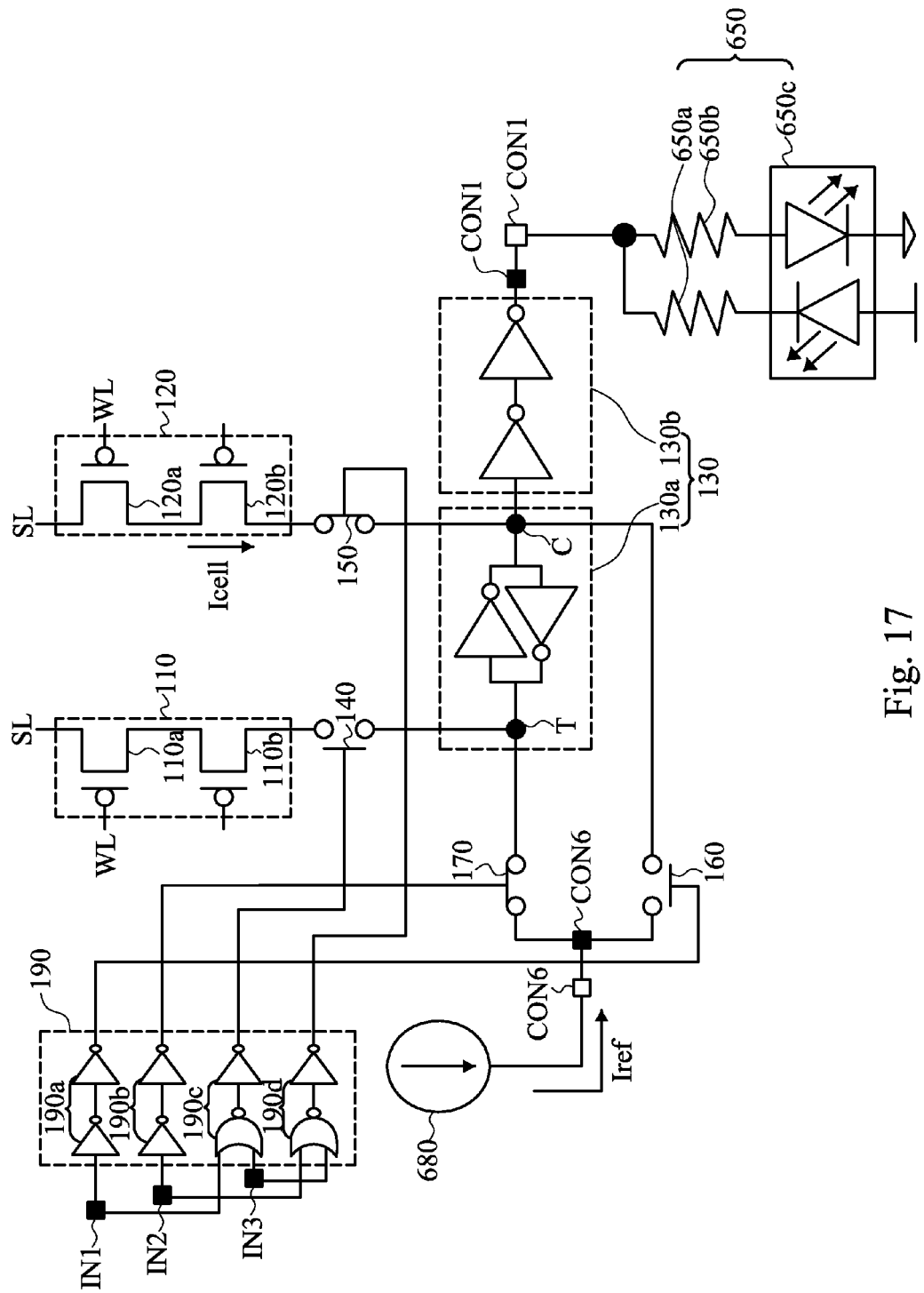
FIG. 17 is a schematic circuit diagram illustrating another state of the switch unit in accordance with some embodiments.
Figure 18:
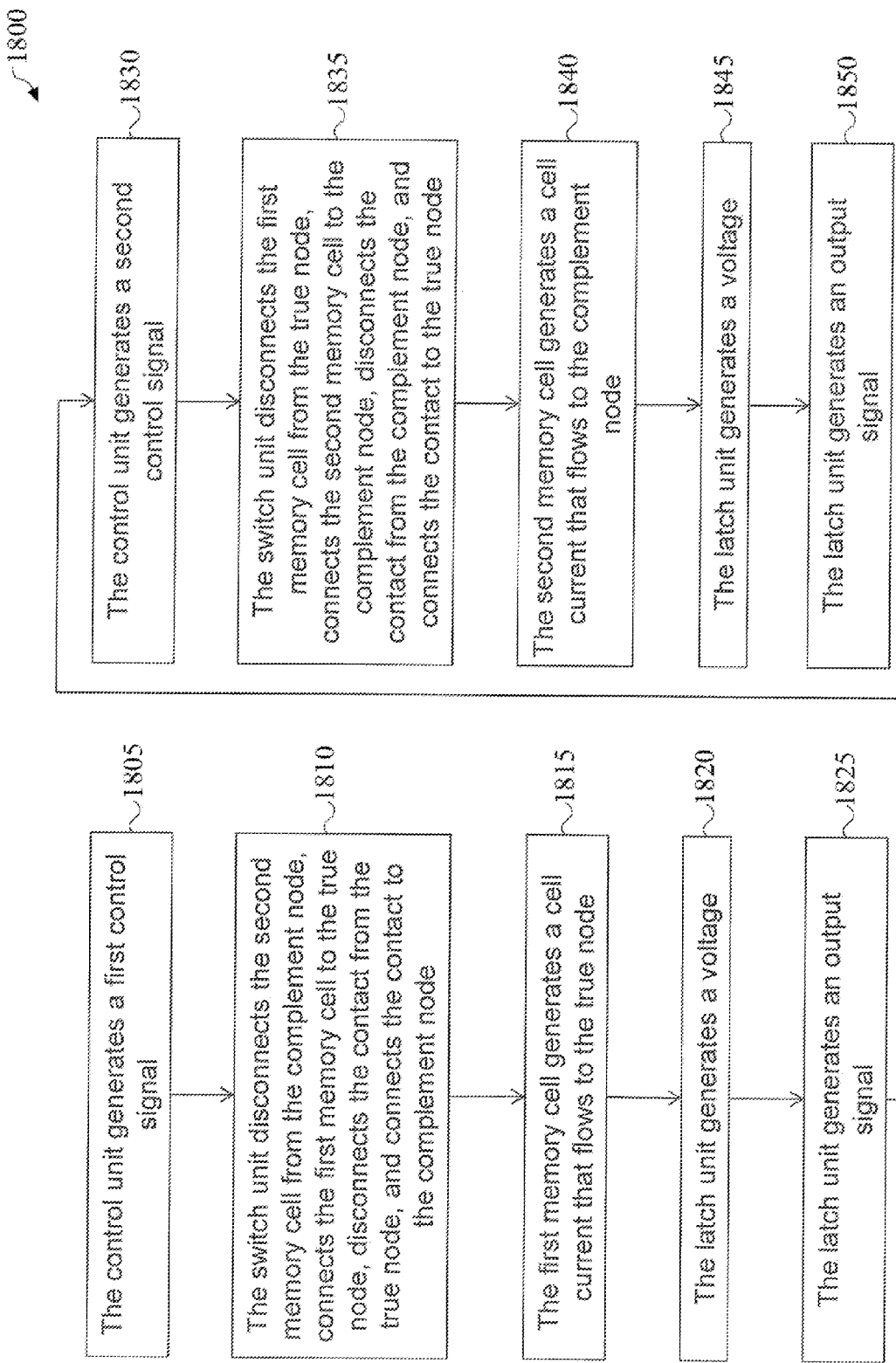
FIG. 18 is a flowchart of the third exemplary method for testing a memory of a semiconductor device in accordance with some embodiments.

As illustrated in FIGS. 16 and 17, the contacts CON1, CON6 of the test device 800 are connected to the contacts CON1, CON6 of the semiconductor device 300, respectively.

In response to a first input signal, in operation 1805, the control unit 190 generates a first control signal that corresponds to the first input signal. In this exemplary embodiment, the first input signal includes a set of logic levels, each of which is applied to a respective one of the inputs IN1, IN2, IN3, and the first control signal includes a set of logic levels, each of which is generated at the output terminal of a respective one of the logic gate circuits 190a, 190b, 190c, 190d.

As illustrated in FIG. 16, in response to the first control signal, in operation 1810: the switch 150 disconnects the memory cell 120 from the complement node C; the switch 140 connects the memory cell 110 to the true node T; the switch 170 disconnects the contact CON6 of the semiconductor device 300 from the true node T; and the switch 160 connects the contact CON6 of the semiconductor device 300 to the complement node C.

Thereafter, in operation 1815, the memory cell 110 generates a cell current Icell that flows to the true node T through the switch 140.

The current source circuit 680 generates a reference current Iref that flows to the complement node C through the contact CON6 of the test device 800, the contact CON6 of the semiconductor device 300, and the switch 160.

In operation 1820, the latch 130a generates a voltage at the true node T and another voltage at the complement node C.

In operation 1825, the buffer 130b generates an output signal, e.g., a logic level, at the output terminal thereof that corresponds to the voltage at the complement node C.

In response to the output signal, the light source 650c emits light, the color of which corresponds to the output signal. For example, the light source 650*c* emits a green light if the output signal is logic 1 or a red light if logic 0.

In response to a second input signal, in operation 1830, the control unit 190 generates a second control signal that corresponds to the second input signal. In this exemplary embodiment, the second input signal includes a set of logic levels, each of which is applied to a respective one of the inputs IN1, IN2, IN3, and the second control signal includes a set of logic levels, each of which is generated at the output terminal of a respective one of the logic gate circuits 190*a*, 190*b*, 190*c*, 190*d*.

As illustrated in FIG. 17, in response to the second control signal, in operation 1835: the switch 140 disconnects the memory cell 110 from the true node T; the switch 150 connects the memory cell 120 to the complement node C; the switch 160 disconnects the contact CON6 of the semiconductor device 300 from the complement node C; and the switch 170 connects the contact CON6 of the semiconductor device 300 to the true node T.

Thereafter, in operation 1840, the memory cell 120 generates a cell current Icell that flows to the complement node C through the switch 150.

The current source circuit 680 generates a reference current Iref that flows to the true node T through the contact CON6 of the test device 800, the contact CON6 of the semiconductor device 300, and the switch 170.

In operation 1845, the latch 130*a* generates a voltage at the true node T and another voltage at the complement node N.

In operation 1850, the buffer 130*b* generates an output signal, e.g., a logic level, at the output terminal thereof that corresponds to the voltage at the complement node C.

In response to the output signal, the light source 650*c* emits light, the color of which corresponds to the output signal. For example, the light source 650*c* emits a green light if the output signal is logic 1 or a red light if logic 0.

When the logic level of the output signal in operation 1825 is logic 1 and when the logic level of the output signal in operation 1850 is logic 0, the memory of the semiconductor device 300 is verified to be functioning properly. Otherwise, e.g., when the logic levels of the output signals in operations 1825 and 1850 are the same, the memory of the semiconductor device 300 is determined to be defective.

An exemplary method 2100 for testing the memory of the semiconductor device 400 using the test device 700 will now be described with reference to FIGS. 19-21. FIG. 19 is a schematic circuit diagram illustrating a state of a switch unit in accordance with some embodiments. FIG. 20 is a schematic circuit diagram illustrating another state of the switch unit in accordance with some embodiments. FIG. 21 is a flowchart of the fourth exemplary method for testing a memory of a semiconductor device in accordance with some embodiments.

Figure 19:
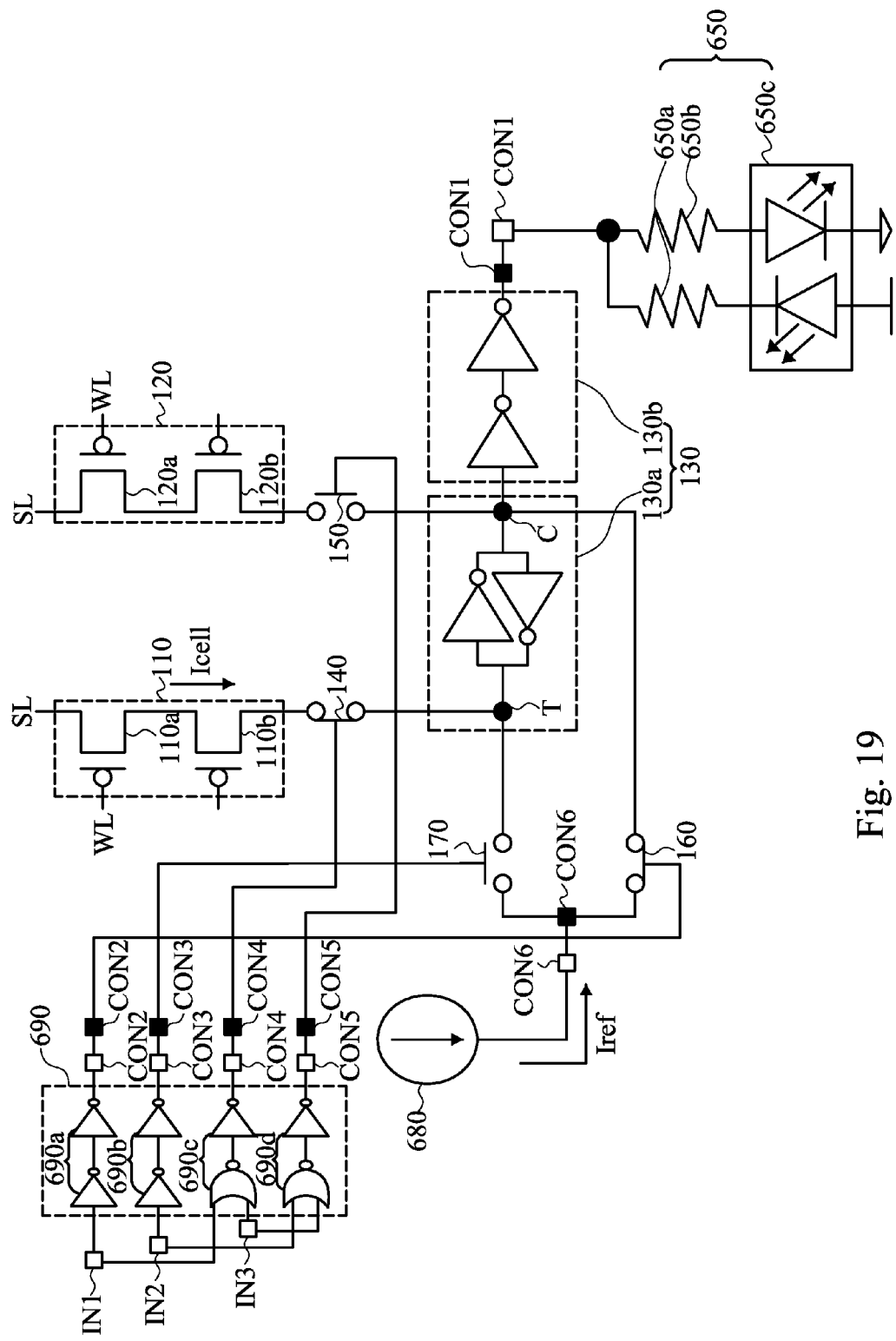
FIG. 19 is a schematic circuit diagram illustrating a state of a switch unit in accordance with some embodiments.
Figure 20:
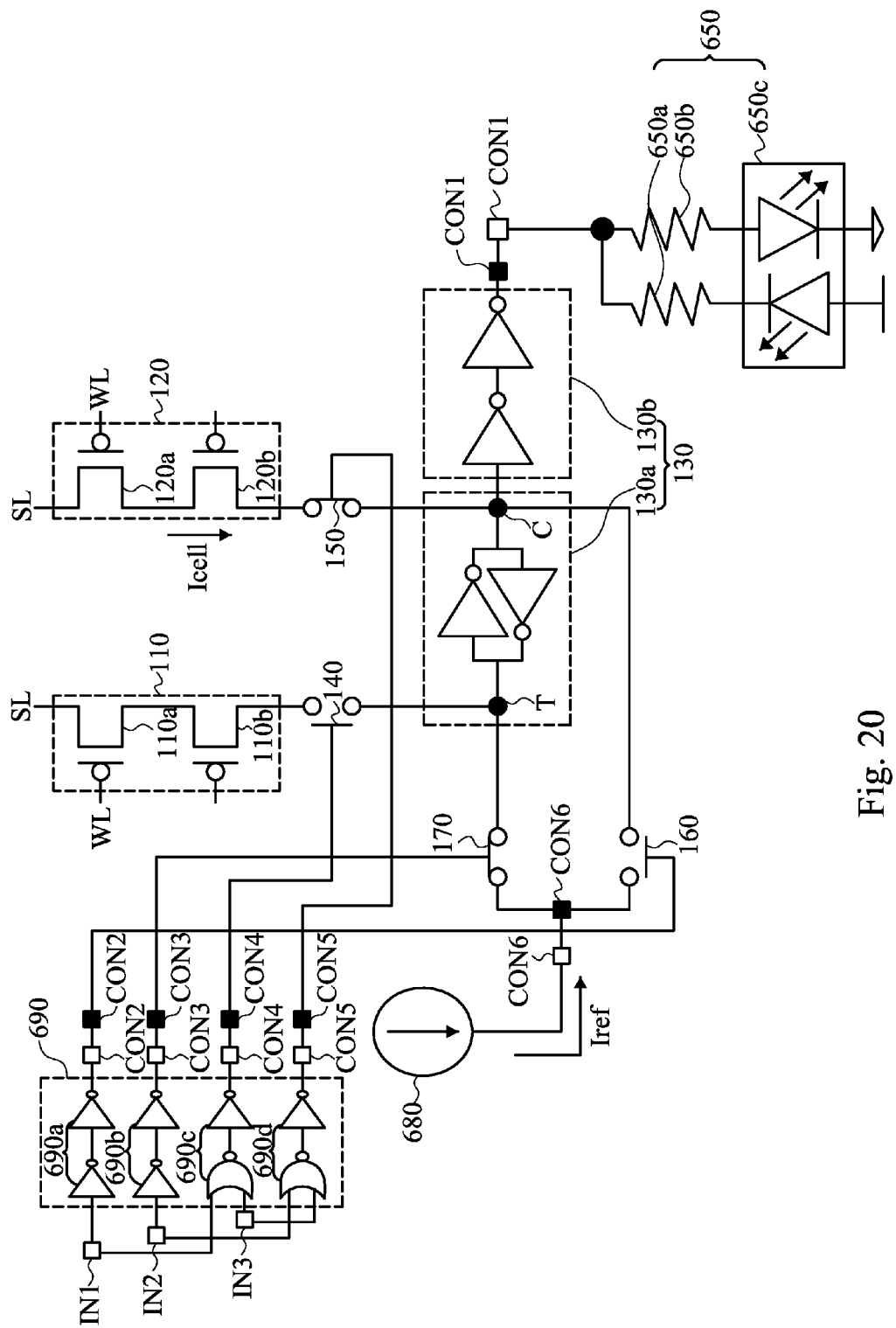
FIG. 20 is a schematic circuit diagram illustrating another state of the switch unit in accordance with some embodiments.
Figure 21:
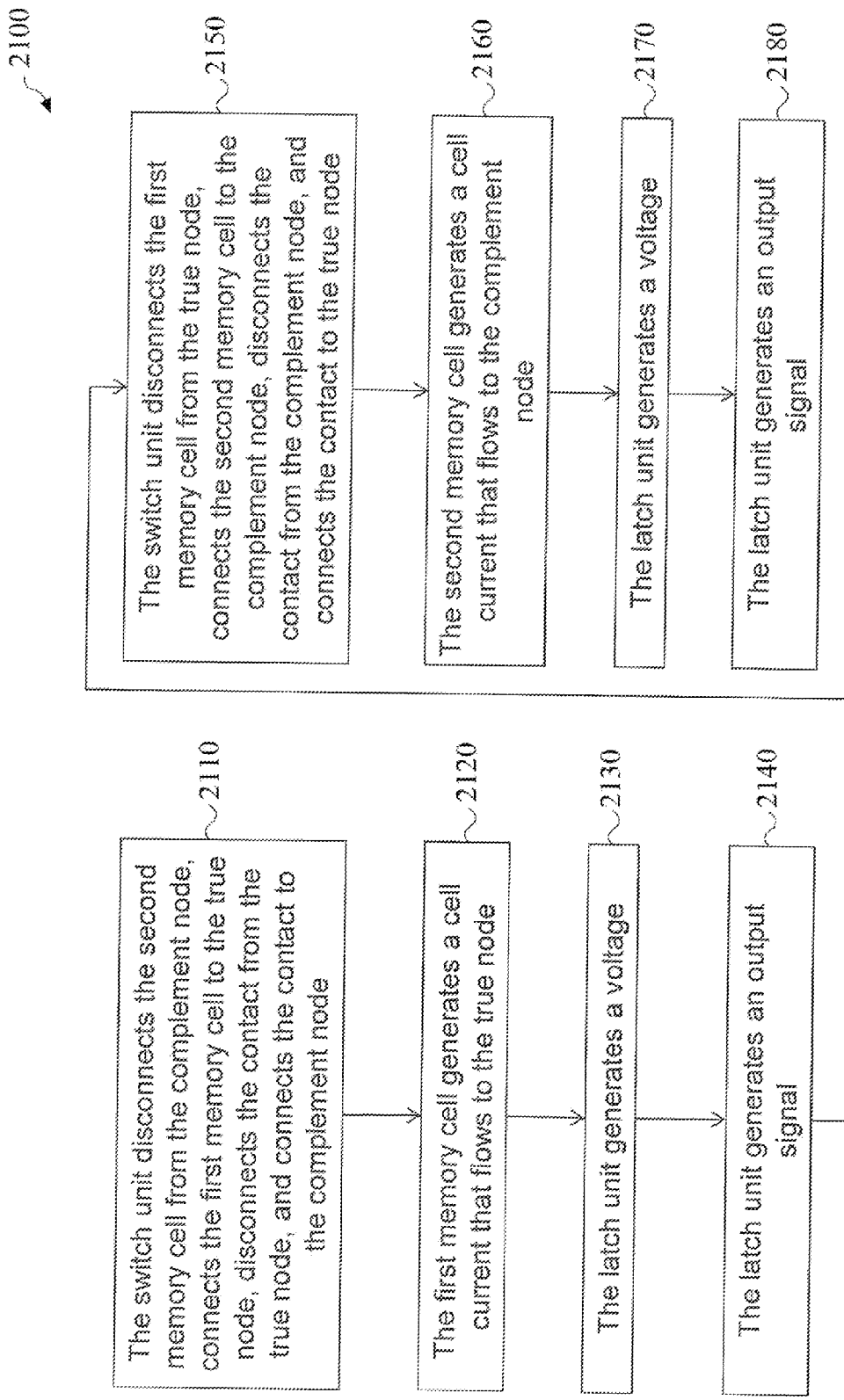
FIG. 21 is a flowchart of the fourth exemplary method for testing a memory of a semiconductor device in accordance with some embodiments.

As illustrated in FIGS. 19 and 20, the contacts CON1, CON2, CON3, CON4, CON5, CON6 of the test device 700 are connected to the contacts CON1, CON2, CON3, CON4, CON5, CON6 of the semiconductor device 400, respectively.

In response to a first input signal, the control unit 690 generates a first control signal that corresponds to the first input signal. In this exemplary embodiment, the first input signal includes a set of logic levels, each of which is applied to a respective one of the inputs IN1, IN2, IN3, and the first control signal includes a set of logic levels, each of which is generated at the output terminal of a respective one of the logic gate circuits 690*a*, 690*b*, 690*c*, 690*d*.

As illustrated in FIG. 19, in response to the first control signal, in operation 2110: the switch 150 disconnects the memory cell 120 from the complement node C; the switch 140 connects the memory cell 110 to the true node T; the switch 170 disconnects the contact CON6 of the semiconductor device 400 from the true node T; and the switch 160 connects the contact CON6 of the semiconductor device 400 to the complement node C.

Thereafter, in operation 2120, the memory cell 110 generates a cell current Icell that flows to the true node T through the switch 140.

The current source circuit 680 generates a reference current Iref that flows to the complement node C through the contact CON6 of the test device 700, the contact CON6 of the semiconductor device 400, and the switch 160.

In operation 2130, the latch 130*a* generates a voltage at the true node T and another voltage at the complement node C.

In operation 2140, the buffer 130*b* generates an output signal, e.g., a logic level, at the output terminal thereof that corresponds to the voltage at the complement node C.

In response to the output signal, the light source 650*c* emits light, the color of which corresponds to the output signal. For example, the light source 650*c* emits a green light if the output signal is logic 1 or a red light if logic 0.

In response to a second input signal, the control unit 690 generates a second control signal that corresponds to the second input signal. In this exemplary embodiment, the second input signal includes a set of logic levels, each of which is applied to a respective one of the inputs IN1, IN2, IN3, and the second control signal includes a set of logic levels, each of which is generated at the output terminal of a respective one of the logic gate circuits 690*a*, 690*b*, 690*c*, 690*d*.

As illustrated in FIG. 20, in response to the second control signal, in operation 2150: the switch 140 disconnects the memory cell 110 from the true node T; the switch 150 connects the memory cell 120 to the complement node C; the switch 160 disconnects the contact CON6 of the semiconductor device 400 from the complement node C; and the switch 170 connects the contact CON6 of the semiconductor device 400 to the true node T.

Thereafter, in operation 2160, the memory cell 120 generates a cell current Icell that flows to the complement node C through the switch 150.

The current source circuit 680 generates a reference current Iref that flows to the true node T through the contact CON6 of the test device 700, the contact CON6 of the semiconductor device 400, and the switch 170.

In operation 2170, the latch 130*a* generates a voltage at the true node T and another voltage at the complement node C.

In operation 2180, the buffer 130*b* generates an output signal, e.g., a logic level, at the output terminal thereof that corresponds to the voltage at the complement node C.

In response to the output signal, the light source 650*c* emits light, the color of which corresponds to the output signal. For example, the light source 650*c* emits a green light if the output signal is logic 1 or a red light if logic 0.

When the logic level of the output signal in operation 2140 is logic 1 and when the logic level of the output signal in operation 2180 is logic 0, the memory of the semiconductor device 400 is verified to be functioning properly. Otherwise, e.g., when the logic levels of the output signals in operations 2140 and 2180 are the same, the memory of the semiconductor device 400 is determined to be defective.

An exemplary method 2400 for testing the memory of the semiconductor device 500 using the test device 600 will now be described with reference to FIGS. 22-24. FIG. 22 is a schematic circuit diagram illustrating a state of a switch unit in accordance with some embodiments. FIG. 23 is a schematic circuit diagram illustrating another state of the switch unit in accordance with some embodiments. FIG. 24 is a flowchart of the fifth exemplary method for testing a memory of a semiconductor device in accordance with some embodiments.

Figure 22:
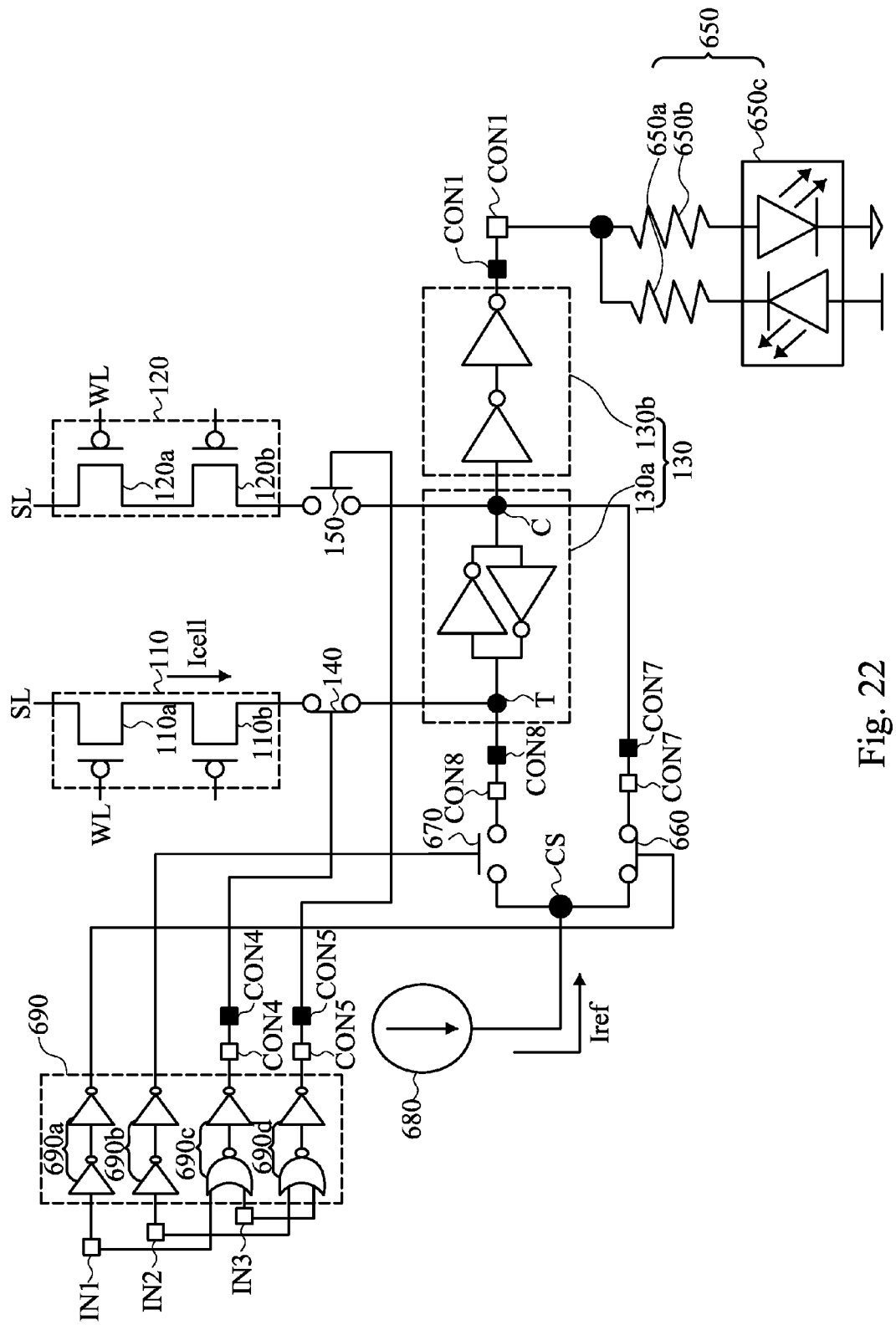
FIG. 22 is a schematic circuit diagram illustrating a state of a switch unit in accordance with some embodiments.
Figure 23:
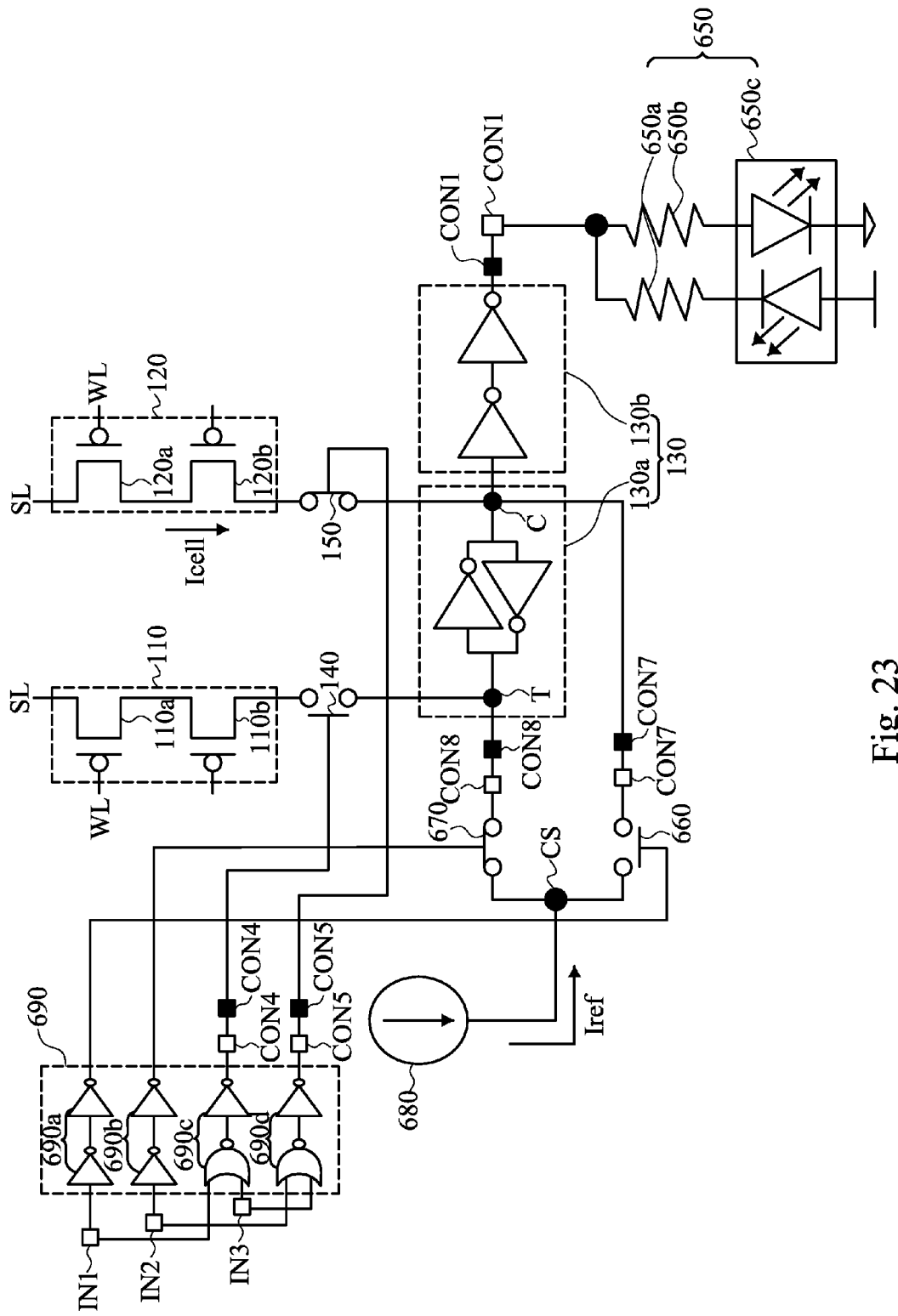
FIG. 23 is a schematic circuit diagram illustrating another state of the switch unit in accordance with some embodiments.
Figure 24:
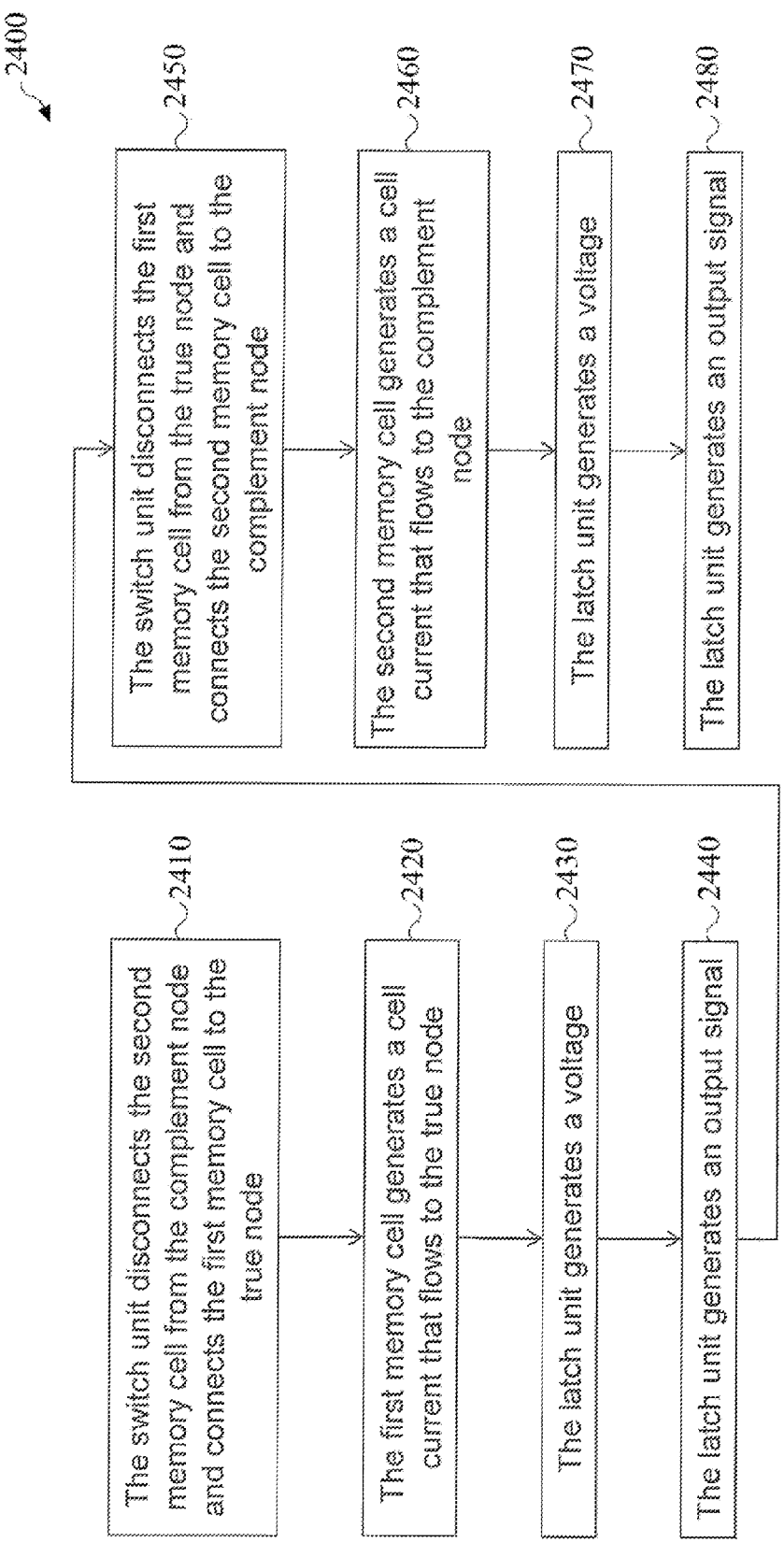
FIG. 24 is a flowchart of the fifth exemplary method for testing a memory of a semiconductor device in accordance with some embodiments.

As illustrated in FIGS. 22 and 23, the contacts CON1, CON4, CON5, CON7, CON8 of the test device 600 are connected to the contacts CON1, CON4, CON5, CON7, CON8 of the semiconductor device 500, respectively.

In response to a first input signal, the control unit 690 generates a first control signal that corresponds to the first input signal. In this exemplary embodiment, the first input signal includes a set of logic levels, each of which is applied to a respective one of the inputs IN1, IN2, IN3, and the first control signal includes a set of logic levels, each of which is generated at the output terminal of a respective one of the logic gate circuits 690a, 690b, 690c, 690d.

As illustrated in FIG. 22, in response to the first control signal, in operation 2410, the switch 150 disconnects the memory cell 120 from the complement node C and the switch 140 connects the memory cell 110 to the true node T.

The switch 670 disconnects the current source node CS from the contact CON8 of the test device 600 and the switch 660 connects the current source node CS to the contact CON7 of the test device 600.

Thereafter, in operation 2420, the memory cell 110 generates a cell current Icell that flows to the true node T through the switch 140.

The current source circuit 680 generates a reference current Iref that flows to the complement node C through the current source node CS, the switch 660, the contact CON7 of the test device 600 and the contact CON7 of the semiconductor device 500.

In operation 2430, the latch 130a generates a voltage at the true node T and another voltage at the complement node C.

In operation 2440, the buffer 130b generates an output signal, e.g., a logic level, at the output terminal thereof that corresponds to the voltage at the complement node C.

In response to the output signal, the light source 650c emits light, the color of which corresponds to the output signal. For example, the light source 650c emits a green light if the output signal is logic 1 or a red light if logic 0.

In response to a second input signal, the control unit 690 generates a second control signal that corresponds to the second input signal. In this exemplary embodiment, the second input signal includes a set of logic levels, each of which is applied to a respective one of the inputs IN1, IN2, IN3, and the second control signal includes a pair of logic levels, each of which is generated at the output terminal of a respective one of the logic gate circuits 690a, 690b, 690c, 690d.

As illustrated in FIG. 23, in response to the second control signal, in operation 2450, the switch 140 disconnects the memory cell 110 from the true node T and the switch 150 connects the memory cell 120 to the complement node C.

The switch 660 disconnects the current source node CS from the contact CON7 of the test device 600 and the switch 670 connects the current source node CS to the contact CON8 of the test device 600.

Thereafter, in operation 2460, the memory cell 120 generates a cell current Icell that flows to the complement node C through the switch 150.

The current source circuit 680 generates a reference current Iref that flows to the true node T through the current source node CS, the switch 670, the contact CON8 of the test device 600, and the contact CON8 of the semiconductor device 500.

In operation 2470, the latch 130a generates a voltage at the true node T and another voltage at the complement node C.

In operation 2480, the buffer 130b generates an output signal, e.g., a logic level, at the output terminal thereof that corresponds to the voltage at the complement node C.

In response to the output signal, the light source 650c emits light, the color of which corresponds to the output signal. For example, the light source 650c emits a green light if the output signal is logic 1 or a red light if logic 0.

When the logic level of the output signal in operation 2440 is logic 1 and when the logic level of the output signal in operation 2480 is logic 0, the memory of the semiconductor device 500 is verified to be functioning properly. Otherwise, e.g., when the logic levels of the output signals in operations 2440 and 2480 are the same, the memory of the semiconductor device 500 is determined to be defective.

It is noted herein that prior to testing, the memories of the semiconductor devices 100, 200, 300, 400, 500 are UV erased once.

In an exemplary embodiment of a memory, the memory comprises a first memory cell, a second memory cell, a latch unit, and a switch unit. The latch unit has a true node and a complement node. The switch unit is responsive to a first control signal and a second control signal, and is configured to connect the first memory cell to the true node and to disconnect the second memory cell from the complement node in response to the first control signal and to connect the second memory cell to the complement node and to disconnect the first memory cell from the true node in response to the second control signal.

In an exemplary embodiment of a semiconductor device, the semiconductor device comprises a memory cell, a latch unit, a switch unit, and a control unit. The latch unit has a node. The control unit is connected to the switch unit and is configured to generate a first control signal and a second control signal. The switch unit is responsive to the first and second control signals, and is configured to connect the memory cell to the node in response to the first control signal and to disconnect the memory cell from the node in response to the second control signal.

In an exemplary embodiment of a method for testing a memory of a semiconductor device, the method comprising: in response to a first control signal, a switch unit connecting a first memory cell to a true node of a latch unit and disconnecting a second memory cell from a complement node of the latch unit; and in response to a second control signal, the switch unit connecting the second memory cell to the complement node and disconnecting the first memory cell from the true node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory comprising:
   a first memory cell;
   a second memory cell;
   a latch unit having a true node and a complement node; and
   a switch unit responsive to a first control signal and a second control signal, and configured to connect the first memory cell to the true node and to disconnect the second memory cell from the complement node in response to the first control signal and to connect the second memory cell to the complement node and to disconnect the first memory cell from the true node in response to the second control signal.

2. The memory of claim 1, wherein the switch unit includes a normally-closed switch connected between the first memory cell and the true node, and another normally-closed switch connected between the second memory cell and the complement node.

3. The memory of claim 1, further comprising a contact, wherein the switch unit is further configured to connect and disconnect the contact to the complement node and from the true node in response to the first control signal and to connect and disconnect the contact to the true node and from the complement node in response to the second control signal.

4. The memory of claim 3, wherein the switch unit includes a normally-open switch connected between the contact and the true node, and another normally-open switch connected between the contact and the complement node.

5. The memory of claim 1, further comprising a current source circuit, wherein the switch unit is further configured to connect and disconnect the current source circuit to the complement node and from the true node in response to the first control signal, and to connect and disconnect the current source circuit to the true node and from the complement node in response to the second control signal.

6. The memory of claim 5, wherein the switch unit includes a normally-open switch connected between the current source circuit and the true node, and another normally-open switch connected between the current source circuit and the complement node.

7. A semiconductor device comprising:
   a first memory cell;
   a second memory cell;
   a latch unit having a first node and a second node;
   a switch unit; and
   a control unit connected to the switch unit and configured to generate a first control signal and a second control signal, wherein the switch unit is responsive to the first and second control signals, and is configured to connect the first memory cell to the first node and to disconnect the second memory cell from the second node in response to the first control signal and to connect the second memory cell to the second node and to disconnect the first memory cell from the first node in response to the second control signal.

8. The semiconductor device of claim 7, wherein the switch unit includes a normally-closed switch connected between the first memory cell and the first node.

9. The semiconductor device of claim 7, wherein the switch unit includes a normally-closed switch connected between the second memory cell and the second node.

10. The semiconductor device of claim 7, further comprising a contact, wherein the switch unit is further configured to connect and disconnect the contact to the second node and from the first node in response to the first control signal and to connect and disconnect the contact to the first node and from the second node in response to the second control signal.

11. The semiconductor device of claim 10, wherein the switch unit includes a normally-open switch connected between the contact and the first node, and another normally-open switch connected between the contact and the second node.

12. The semiconductor device of claim 7, further comprising a current source circuit, wherein the switch unit is further configured to connect and disconnect the current source circuit to the second node and from the first node in response to the first control signal and to connect and disconnect the current source circuit to the first node and from the second node in response to the second control signal.

13. The semiconductor device of claim 12, wherein the switch unit includes a normally-open switch connected between the current source circuit and the first node, and another normally-open switch connected between the current source circuit and the second node.

14. A method for testing a memory of a semiconductor device, the method comprising:
   in response to a first control signal, a switch unit connecting a first memory cell to a true node of a latch unit and disconnecting a second memory cell from a complement node of the latch unit; and
   in response to a second control signal, the switch unit connecting the second memory cell to the complement node and disconnecting the first memory cell from the true node.

15. The method of claim 14, further comprising:
   in response to the first control signal, the switch unit connecting and disconnecting a contact to the complement node and from the true node; and
   in response to the second control signal, the switch unit connecting and disconnecting the contact to the true node and from the complement node.

16. The method of claim 14, further comprising:
   in response to the first control signal, the switch unit connecting and disconnecting a current source circuit to the complement node and from the true node; and
   in response to the second control signal, the switch unit connecting and disconnecting the current source circuit to the true node and from the complement node.

17. The method of claim 14, further comprising:
   in response to a first input signal, a control unit generating the first control signal; and
   in response to a second input signal, the control unit generating the second control signal.

18. The method of claim 14, further comprising:
   the first memory cell generates a cell current that flows to the true node; and
   the latch unit generates a voltage, and an output signal that corresponds to the voltage.

19. The method of claim 14, further comprising:
   the second memory cell generates a cell current that flows to the complement node; and
   the latch unit generates a voltage, and an output signal that corresponds to the voltage.

* * * * *